United States Patent [19]

Tuller et al.

[11] Patent Number: 5,403,461
[45] Date of Patent: Apr. 4, 1995

[54] SOLID ELECTROLYTE-ELECTRODE SYSTEM FOR AN ELECTROCHEMICAL CELL

[75] Inventors: Harry L. Tuller, Wellesley; Steve A. Kramer, Somerville; Marlene A. Spears, Woburn, all of Mass.

[73] Assignee: Massachusetts Institute of Technology, Cambridge, Mass.

[21] Appl. No.: 29,159

[22] Filed: Mar. 10, 1993

[51] Int. Cl.⁶ .......................... C25B 9/00; H01M 8/10
[52] U.S. Cl. ..................... 204/252; 204/283; 429/30; 429/33; 429/40
[58] Field of Search .............. 429/33, 40, 30, 41, 429/199, 193, 209, 218; 204/283, 295, 252

[56] References Cited

U.S. PATENT DOCUMENTS

| | | | |
|---|---|---|---|
| 4,233,142 | 11/1980 | Rohr et al. | 204/195 S |
| 4,412,904 | 11/1983 | Rohr et al. | 204/424 |
| 4,562,124 | 12/1985 | Ruka | 429/33 |
| 4,799,936 | 1/1989 | Riley | 29/623.1 |
| 5,055,440 | 10/1991 | Chu et al. | 502/303 |
| 5,093,301 | 3/1992 | Chu et al. | 502/303 |
| 5,143,801 | 9/1992 | Bates | 429/33 |
| 5,171,645 | 12/1992 | Khandkar | 429/33 |
| 5,175,064 | 12/1992 | Labinger et al. | 429/40 |
| 5,298,235 | 3/1994 | Worrell et al. | 429/33 |

FOREIGN PATENT DOCUMENTS

| | | |
|---|---|---|
| 0514842A1 | 5/1992 | European Pat. Off. . |
| 1288759 | 11/1989 | Japan . |
| WO92/12106 | 7/1992 | WIPO . |

OTHER PUBLICATIONS

Singer et al. New Solid Conductors of Na+ and K+ Ions; National Aeronautics and Space Administration, Lewis Research Center, Cleveland, Ohio pp. 614–617 May 1976.

J. B. Goodenough et al., "Oxide ion electrolytes", Materials Science and Engineering, B12, (1992), pp. 357–364 no month available.

B. C. H. Steele, "Oxygen ion conductors and their technological applications", Materials Science and Engineering, B13, (1992), pp. 79–87 no month available.

H. L. Tuller et al., "Doped Ceria as a Solid Oxide Electrolyte", Journal of the Electrochemical Society, 122, (1975), pp. 255–259 no month available.

T. G. Stratton et al., "Thermodynamics and Transport Studies of Mixed Oxides:CeO₂-UO₂ System", J. Chem. Soc. Faraday Trans. 2, 83, (1987), pp. 1143–1156 no month available.

*Primary Examiner*—Kathryn Gorgos
*Attorney, Agent, or Firm*—Florence Fusco McCann

[57] ABSTRACT

An electrochemical device including a solid electrolyte and solid electrode composed of materials having different chemical compositions and characterized by different electrical properties but having the same crystalline phase is provided. A method for fabricating an electrochemical device having a solid electrode and solid electrolyte characterized by the same crystalline phase is also provided.

67 Claims, 8 Drawing Sheets ns and electron-gas density wave formation and
SOLID ELECTROLYTE-ELECTRODE SYSTEM FOR AN ELECTROCHEMICAL CELL The United States government has rights in this invention based on grant DE-FG02-86ER45261 from the Department of Energy.

BACKGROUND OF THE INVENTION

1. Field of the Invention

The invention relates to a solid electrolyte-electrode system for use in an electrochemical cell. More particularly, the invention relates to a solid oxide electrolyte-electrode system for use in a solid state electrochemical cell.

2. Description of the Prior Art

Electrochemical devices, particularly solid state electrochemical devices such as those used for energy conversion and storage, gas sensing, and gas separation and purification require optimized and compatible solid electrolyte and electrode materials. Different, specific demands are placed on the electrical conductivity properties of electrolyte and electrode materials making up those devices.

The total conductivity of a material, due to both ionic and electronic charge carriers, is equal to the sum of its ionic and electronic conductivity. The fraction of the total conductivity carried by ions is referred to as the ionic transference number and the fraction of the total conductivity carried by electrons is referred to as the electronic transference number.

Solid electrolyte materials should be primarily ionically conductive and have ionic transference numbers close to unity and have electronic transference numbers close to zero to avoid cell discharge under open circuit conditions due to gas permeation. Ionic conductivity should be high to maximize cell voltage and minimize resistive losses. Typically, electrolytes meeting the above criteria and having sufficiently high conductivities to be useful in practical electrochemical devices have oxygen ions or hydrogen ions, protons, as the ionically conductive species. For oxygen ion conductor solid electrolyte materials, the ionic transference number must remain near unity over a wide range of oxygen concentrations as measured usually in terms of oxygen partial pressure. Furthermore, the electrolyte must be chemically and mechanically stable over the service temperatures at which the electrochemical device is to operate.

Solid electrodes, like solid electrolytes, must be chemically and mechanically stable at electrochemical device service temperatures and device environments. Additionally, solid electrodes must be chemically compatible with the solid electrolytes with which they are used to avoid formation of chemical reaction products which can compromise electrochemical device operation.

Special requirements are placed on solid electrodes used in fuel cells where oxidation and reduction reactions occur respectively at the anode and cathode electrodes. In order to achieve rapid reaction kinetics and avoid losses caused by overpotentials at the electrodes, ionic and electronic carrier species and gas phase species must be rapidly supplied to or removed from the electrode/electrolyte interface. Rapid kinetics and loss prevention is accomplished either by using electronically conductive electrodes with sufficient porosity to allow gas molecules to reach the three phase (electrolyte-reactant-electrode) interface or preferably by using an electrode characterized by mixed ionic-electronic conduction (MIEC) whose surface is everywhere catalytically active.

Conventional electrochemical cells typically use stabilized zirconia (e.g. $ZrO_2$ stabilized with 9 mol % $Y_2O_3$) as the solid electrolyte because of its excellent stability with respect to oxidation and reduction and high oxygen ion conductivity ($\sigma = 10^{-1}$ S/cm at 1000° C.) along with doped $LaMnO_3$, doped $LaCrO_3$ and Ni—$ZrO_2$ cermet solid electrode materials. When the electrochemical device is a fuel cell, perovskite crystal structured $LaMnO_3$ and $LaCrO_3$ oxides serve as the air electrode and interconnect and a Ni—$ZrO_2$ cermet is the fuel electrode. Such conventional zirconia based electrolyte and electrode systems are described in Japanese Patent No. JP 1288759 dated Nov. 21, 1989; U.S. Pat. No. 4,233,142 to Rohr et al., issued Nov. 11, 1980; and U.S. Pat. No. 4,412,904 to Rohr et al., issued Nov. 1, 1983.

Conventional zirconia electrolyte based electrochemical cells have several limitations among which are the following. Efficient cell operation is limited to approximately 900°–1000° C. resulting from the high oxygen ion conductivity activation energy of 0.9–1.0 ev characteristic of zirconia based materials which results in sharply decreasing electrolyte ionic conductivity with temperature and interfacial electrode resistance which rapidly increases at low temperature. Furthermore, the cell lifetime of a zirconia electrolyte based cell is limited as a result of chemical reactions between the zirconia electrolyte and the $LaMnO_3$ and $LaCrO_3$ electrodes to form resistive intermediate phases; cracking due to thermal-mechanical stresses that arise between the different materials in contact at the electrolyte-electrode interface; densification of porous electrodes thus limiting gas access to and removal from the electrolyte-electrode interface; and aging of the non-equilibrium cubic fluorite phase of stabilized zirconia resulting in ordering and trapping of the oxygen charge carriers thereby resulting in reduced electrolyte conductivity.

Thus, there exists a need for a stable electrolyte-electrode system capable of operating at temperatures in the range of from about 900°–1000° C. or preferably lower than the operating range of conventional zirconia electrolyte-based technology; minimizing stability difficulties resulting from chemical reactions and thermal mechanical stresses between the different compounds and aging of the electrolyte; and exhibiting enhanced electrode kinetics.

SUMMARY OF THE INVENTION

The invention provides an electrochemical apparatus which includes a solid electrolyte in electrical contact with a solid electrode having the same crystalline phase as the solid electrolyte.

In another aspect of the invention, a method is provided for fabricating an electrochemical device which includes preparing a solid electrolyte having a first crystalline phase and placing this solid electrolyte in electrical contact with a solid electrode having the same crystalline phase.

Objects of the invention include providing an electrochemical device operating at lower temperatures than conventional electrolyte-electrode systems, having enhanced resistance to chemical instability resulting from chemical reactions and mechanical instability resulting from thermal expansion coefficient and lattice parameter mismatch between the differing compounds making up the electrode and electrolyte, resisting electrolyte aging and exhibiting enhanced electrode kinetics.

A further object of the invention is provision of a method for preparing an electrochemical device including a solid electrolyte and solid electrode having the same crystalline phase thus allowing for simplified processing since a single crystalline phase is used for the solid electrode and electrolyte cell components with the ability to compositionally grade the electrochemical apparatus by providing compositionally graded layers between the solid electrolyte and solid electrode thereby further minimizing thermal-mechanical stresses within the electrochemical apparatus.

Other and further objects, features and advantages of the present invention will be readily apparent to those skilled in the art in reading the description of preferred embodiments which follows.

DETAILED DESCRIPTION OF THE INVENTION

Figure 1:
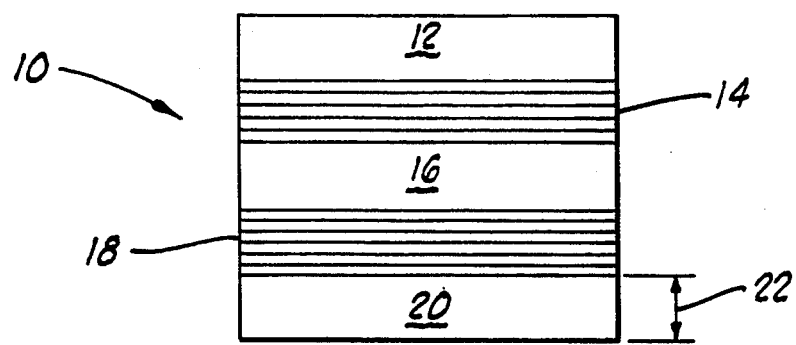
FIG. 1 is a schematic cross-section of a solid oxide fuel cell including a graded region.

The invention provides an electrochemical apparatus which includes a solid electrolyte in electrical contact with a solid electrode having the same crystalline phase as the solid electrolyte. As used herein in the specification and claims, the term crystalline phase refers to a solid with a given crystal structure or its derivatives formed by an order-disorder process or impurity or defect introduction. The crystalline phase, while often single phase may be multiphase wherein there exists a mixture of the given structure with its derivatives and/or between its derivatives. This definition holds even if minority phases with different structures are formed in the above mixtures.

The solid electrolyte and solid electrode can be respectively characterized by a solid electrolyte lattice constant and a solid electrode lattice constant as well as by a lattice constant mismatch which is a measure of the difference between the solid electrolyte lattice constant and the electrode lattice constant. Typically, the lattice constant mismatch is in the range of from about 0.1% to about 5%, more preferably in the range of from about 0.05% to about 2% and most preferably in the range of from about 0 to about 0.7%. The electrochemical apparatus is configured as a monolithic graded structure which further includes regions of graded composition including gradations in composition between the composition of the solid electrode and of the solid electrolyte, and is, therefore, also characterized by gradation in the lattice constant corresponding to the gradation in composition of the graded region in order to minimize the lattice constant mismatch between the solid electrolyte lattice constant and the solid electrode lattice constant. It is also characterized by a gradation in the coefficient of thermal expansion which further limits stresses built up at interfaces between solid electrolyte and solid electrode layers having differing chemical compositions during temperature excursions to which the apparatus is subjected during operation.

Ionic conductivity is an activated, Arrhenius process characterized by an ionic conductivity activation energy which can be in the range of from about 1.5 ev to about 0.5 ev, more preferably in the range of from about 0.9 ev to about 0.5 ev and most preferably in the range of from about 0.7 ev to about 0.5 ev.

The solid electrode can be characterized by an electronic conductivity in the range from about $10^{-3}$ S/cm to about $10^3$ S/cm more preferably in the range of from about $10^{-1}$ S/cm to about $10^3$ S/cm, and most preferably in the range of from about 10 S/cm to about $10^3$ S/cm.

The electrochemical apparatus can further include a solid interconnect characterized by predominantly electronic conductivity in the range of from about 1 S/cm to about $10^{-3}$ S/cm. Interconnects in a fuel cell, for example must display stability in both oxidizing and reducing atmospheres and have high electronic conductivity to minimize permeation between the anode and the cathode.

In a preferred embodiment, the solid electrode is characterized by mixed ionic and electronic conductivity (MIEC) and simultaneously displays an ionic conductivity of from about $10^{-3}$ S/cm to about 1 S/cm, more preferably in the range of from about $10^{-2}$ S/cm to about 1 S/cm, and most preferably in the range of from about $10^{-1}$ S/cm to about 1 S/cm along with an electronic conductivity in the range from about $10^{-3}$ S/cm to about $10^3$ S/cm, more preferably in the range of from about $10^{-1}$ S/cm to about $10^3$ S/cm, and most preferably in the range of from about 10 S/cm to about $10^3$ S/cm.

The apparatus can further include a solid interconnect characterized by a predominantly electronic conductivity in the range of from about 1 S/cm to about $10^3$ S/cm.

The solid electrolyte and solid electrode crystalline phase can be a solid solution having a crystalline phase with a cation or multiple cation lattices which accommodate various isovalent or aliovalent substitutions as well as and/or ranges of cation and anion non-stoichiometry and are also capable of accommodating cations of different sizes which affect electrical properties through disordering the cation lattice and having electrical properties which can be controllably varied by varying solid solution composition so that materials of the same crystalline phase characterized alternatively by ionic conductivity, electronic conductivity, and mixed ionic and electronic conductivity (MIEC) can be produced to be used, respectively as solid electrolyte, interconnect and solid electrode components of the electrochemical apparatus. The solid solution can be characterized by the formula $(A_{1-j}D_j)_x(B_{1-k}E_k)_yO_zX_w$ where A is a cation of an element such as Ca, Sr, Ba, Sc, Y, La, Ce, Pr, Nd, Sm, Eu, Gd, Tb, Dy, Ho, Er, Tm, Yb, Lu, Tl, Pb, Bi, Pm and mixtures thereof: B is a cation of an element such as Al, Cr, Mn, Fe, Co, Ni, Cu, In, Ti, Zr, Hf, Sn, Pb, Ru, Os, Ir, Rh, Pd, Pt, Sb, V, Nb, Ta, Mo, W and mixtures thereof; D is a cation of an element such as Na, K, Ca, St, Ba, Sc, Y, La, Ce, Pt, Nd, Sm, Eu, Gd, Tb, Dy, Ho, Er, Tm, Yb, Lu, Tl, Pb, Bi and Pm; E is a cation of an element such as Al, Sc, Cr, Mn, Fe, Co, Ni, Cu, In, Ti, Zr, Hf, Sn, Pb, Ru, Os, Ir, Rh, Mo, W Pd, Pt, Sb, V, Nb and Ta; O is oxygen; X is an anion of an element such as S, N, F, Cl, or OH; x is in the range of $0<x<5$; j is in the range $0\leq w<1$; y is in the range $0<y<5$; k is in the range $0\leq k<1$; z is in the range $2<z<11$; w is in the range $0<w<1$; and x, j, y, k, z, and w are selected to satisfy overall electroneutrality conditions for the formula.

In a preferred embodiment, the solid solution can be a solid solution characterized by a pyrochlore crystal structure of the formula $A_2Ti_2O_{7-\delta}$ where A can be a cation of an element such as Sm, Gd, Ho, Ce, Pt, Nd, Pm, Eu, Tb, Dy, Er, Tm, Yb, Lu, Y, Bi or Pb and $\delta$ indicates the degree of non-stoichiometry, i.e. the extent of oxygen deficiency or excess relative to seven oxygens per formula unit, with $\delta$ in the range of from about $\pm 0.001$ to about $\pm 0.3$, more preferably in the range of from about $\pm 3.001$ to about $\pm 0.2$ and most preferably in the range of from about $\pm 0.01$ to about $\pm 0.1$.

Advantages of the pyrochlore system include flexibility in controlling the relative level of ionic and electronic conductivity in this system. It is possible, by compositional control, to achieve high ionic conductivity and low electronic conductivity for the solid electrolyte, and high MIEC for the electrodes and high electronic conductivity and low ionic conductivity for the interconnect in the same pyrochlore structure in which the electrodes (air and fuel), the interconnect and the electrolyte are made from the same materials system. Any residual stresses remaining due to small lattice mismatches between the components can be largely eliminated by compositional grading as is often utilized in the semiconductor industry.

The electrical properties of the rare earth titanate pyrochlore crystal structure solid solution can be varied and controlled by varying the identity of the A cation. The A cation has an A cation valence and can be partially replaced by a first dopant cation which has a first dopant cation valence lower than the A cation valence. In a preferred embodiment, the A cation is a $Gd^{3+}$ cation and the first dopant cation is a $Ca^{2+}$ cation and the titanate solid solution has the formula $(Gd_{1-j}Ca_j)_2Ti_2O_{7-\delta}$ wherein j is the range of from about 0 to 0.25, more preferably in the range of from about 0.0025 to about 0.15, and most preferably in the range of from about 0.02 to about 0.10 and $\delta = j/2$ to increase the ionic conductivity of the titanate solid solution solid electrolyte. The ionic conductivity can also be increased by substituting a lower valent ion such as $Al^{3+}$ on the $Ti^{4+}$ site. The ionic conductivity of the titanate solid solution solid electrolyte can be also be increased by partially replacing the A cation with a smaller isovalent cation such as $Dy^{3+}$, or $Y^+$ or $Ho^{3+}$. Yet another way to increase the conductivity of the rare earth titanate solid solution solid electrolyte is by partially replacing Ti with a larger, isovalent cation such as $Zr^{4+}$, $Sn^{4+}$ or $Hf^{4+}$.

It is also possible to increase the electronic conductivity of the rare earth titanate solid solution solid electrode by partially replacing Ti with a donor cation such as $Nb^{5+}$, $W^{6+}$, $MO^{6+}$, $Ta^{5+}$ or $V^{5+}$. The A cation can be also be replaced by a second dopant cation having a second dopant cation valence higher than the A cation valence such as $Th^{4+}$, $U^{5+}$, $Pr^{4+}$, $Tb^+$ or $Ce^{4+}$ to increase the electronic conductivity of the solid electrode.

In the formula $A_2Ti_2O_{7-\delta}$, Ti can be partially replaced by an acceptor dopant cation which is characterized by an equilibrium concentration of the ion in more than one cationic valence state such as, a Ru cation which maintains equilibrium among the $Ru^{4+}$, $Ru^{3+}$, and $Ru^{2+}$ states. Other acceptor dopant cations include cations of the elements Os, Ir, Rh, Pd, Pt and Re which are characterized by extended orbital states and result in metallic oxides or semiconducting oxides with very narrow bandgaps. They can be used for solid electrodes simultaneously exhibiting mixed ionic and electronic conductivity (MIEC).

The solid electrolyte and solid electrode can also be made of a crystalline phase which is a solid solution characterized by a perovskite-derived crystal structure and having the formula $ABO_{3-6}$ where A is a cation of an element such as Ba, Sr, La and Ca; B is a cation of an element such as Ti, Zr, Co, Ni, Sr, Mn, Cu, Fe, In, Mg, Zn, Sc, Ta, Nb and Al and 6 is in the range of from 0 to about 3.

The chemical composition of the perovskite derived crystal structure solid solution can be controlled to produce a solid electrode and a solid electrolyte having optimized electronic conductivity and ionic conductivity, respectively. The ionic conductivity of the solid electrolyte can be increased by partially replacing the A and/or B cation by a third dopant cation having a valence which is lower than the A and/or B cation valence respectively. The A cation can be partially replaced by a cation such as a cation of an element such as K, Ca, Mg, Sr or Na. The B cation can be partially replaced by a lower valent cation of an element such as Al, Zn, Mg, In or Sc. Finally, the ionic conductivity of the solid electrolyte can also be increased by partially replacing the B cation by a cation with a higher charge such as $Zr^{4+}$, $Ce^{4+}$, $Hf^{4+}$ or $Th^{4+}$.

The n-type electronic conductivity of the solid electrodes can be increased by partially replacing the A and/or B cation with a donor cation such as $Nb^{5+}$, $Ta^{5+}$, $W^{6+}$, $V^{5+}$, $Mo^{6+}$, $Th^{4+}$, $Pr^{4+}$, $Tb^{4+}$ and trivalent rare earth cations. The mixed ionic and electronic conductivity (MIEC) of a solid electrode can be simultaneously increased by partially replacing the B cation with a second acceptor dopant cation of an element such as Fe, Co, Ni, Cr, Mn, Cu, Ru, Os, Ir, Rh, Pd, Pt or Re.

Suitable perovskite related solid solution systems are systems of the $A_2B_2O_5$ type such as $Ca_2(Al_kFe_{1-k})_2O_5$ and $Sr_2(Al_kFe_{1-k})_2O_5$, as well as solid solutions of the $A_3B_2B'O_8$ type such as $Ba_3\{(In_{1-k}Fe_k)_2Zr\}O_8$, $Ba_3\{In_2(Zr_{1-k'}Ti_{k'})\}O_8$ where k' refers to the B' cation, $(Ca_2Y)(Fe_{1-k}(Al_k)_3O_8$ and $Ca_3(Fe_2Ti)O_8$ and solid solutions of the type $ABO_3$, e.g. $(La_{1-j}Sr)(Al_{1-k}Mn_k)O_3$.

The solid electrolyte and solid electrode in another preferred embodiment can be made from a solid solution characterized by a fluorite crystal structure and by the formula $A_{i-j}D_jO_{2+\delta}$ wherein A is a cation of an element such as Ce, Hf, Zr, or Th and D is a cation of an element such as U, Zr, Hf, Th, Pr and Tb and e indicates the degree of nonstoichiometry, i.e. the extent of oxygen deficiency or oxygen excess relative to two oxygens per formula unit and is the range of from about 0 to about ±0.3, more preferably in the range of from about 0 to about 0.1, and most preferably in the range of from about 0 to about 0.03.

The electrical properties, i.e. electronic and ionic conductivity, respectively, of a solid electrode and a solid electrolyte made from a solid solution crystalline phase having fluorite crystal structure and characterized by the formula $A_{i-j}O_jO_{2+\delta}$ can be optimized by controlled variation of the composition of the fluorite crystal solid solution.

The ionic conductivity of the solid electrolyte can be increased by partially replacing the A cation by a fourth dopant cation having a valence lower than the A cation valence such as a cation of the elements including Y, Ca, La, Gd or Nd.

The electronic conductivity of the solid electrolyte can be increased by partially replacing the A cation by a donor cation of an element such as U, Ta or Nb.

Finally, the electronic conductivity of the solid electrode can be increased by selecting an D cation capable of simultaneously increasing mixed ionic and electronic conductivity (MIEC), such as Ce in $ThO_2$ with energy levels in the bandgap of the fluorite crystal structure solid solution material making up the solid electrode and thus forming impurity bands within the bandgap of the solid electrode material. Ionic conductivity is increased by reduction of $Ce^{4+}$ to $Ce^{3+}$. Other suitable dopants include Pr and Tb cations.

For example, high electronic conductivity can be produced in $CeO_2$ by the addition of uranium into solid solution. $Ce_{0.95}U_{0.05}O_2$ exhibits an electronic conductivity of greater than 1 S/cm at 1000° C. between $10^{-16}$ atm $< P_{O2} < 1$ atm. On the other hand, yttria-doped $CeO_2$ is an excellent oxygen ion conductor having an ionic conductivity of $10^{-1}$ S/cm at 1000° C. A graded structure of $CeO_2$: $U/CeO_2$: $Y/CeO_2$: U can be used as a fuel cell element. Undoped $CeO_2$ can also be used as a solid electrode under reducing conditions where it exhibits n-type conductivity due to reduction to $CeO_{2-x}$.

The solid electrode and solid electrolyte can be formed from a crystalline phase which can be a single crystal phase or a polycrystalline phase.

The electrochemical apparatus can be a graded solid oxide fuel cell having a solid oxide anode layer made of anode material characterized by a first crystalline phase; a solid oxide electrolyte layer made of electrolyte material characterized by the same first crystalline phase; a solid oxide cathode layer made of cathode material and characterized by the same first crystalline phase; a first graded region separating the solid oxide anode layer from the solid oxide electrolyte layer and a second graded region separating the solid oxide electrolyte layer from the solid oxide cathode layer.

The solid oxide anode layer, solid electrolyte layer, solid oxide cathode layer, first graded region and second graded region are, respectively, characterized by a solid oxide anode layer composition, a solid oxide electrolyte layer composition, a solid oxide cathode layer composition, a first graded region composition and a second graded region composition. The first graded layer has a first graded layer/anode interface and a first graded layer/electrolyte interface and has a spatially graded composition which varies from the solid oxide anode layer composition at the first graded layer/anode interface to the solid oxide electrolyte layer composition at the first graded layer/electrolyte interface. The second graded layer also has a second graded layer/cathode interface where the second graded layer contacts the solid oxide cathode. The second graded layer has a spatially graded composition which varies from the solid oxide electrolyte composition at the second graded layer/electrolyte interface to the solid oxide cathode composition at the second graded layer/cathode interface.

An interconnect to connect one electrochemical device with another electrochemical device can also be provided. The interconnect is in electrical contact with the solid electrode and a compositionally graded layer can be provided between the interconnect and the solid electrode to allow for a gradual composition change between the solid electrode and interconnect materials and, hence, a gradual change in thermal expansion and electrical properties, as well.

The thickness of the graded layers and the degree of steepness of the compositional grading will depend upon the extent of lattice parameter mismatch and thermal expansion coefficient mismatch existing between the neighboring material layers which have been selected on the basis of their electrical properties and suitability to function as a particular electrochemical device component.

The monolithic graded solid oxide fuel cell can be configured to utilize the advantageous properties of a solid oxide electrolyte and solid oxide electrode made of material having the same crystalline phase.

FIG. 1 shows solid oxide fuel cell 10 wherein cathode layer 12, second graded region 14, solid oxide electrolyte layer 16, first graded region 18 and solid oxide anode 20 each have approximately equal thicknesses 22.

Figure 2:
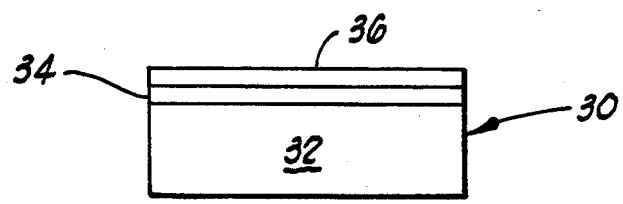
FIG. 2 is a schematic cross-section of a solid oxide fuel cell including a very thin solid oxide electrolyte and solid oxide cathode layer.

In a second preferred embodiment, as shown in the schematic cross-sectional view of a solid oxide fuel cell of FIG. 2, solid oxide fuel cell 30 includes anode layer 32 covered by a very thin solid oxide electrolyte layer 34 which can be as thin as approximately 100 Angstroms and cathode layer 36 as the outer layer of the "sandwich-like" solid oxide fuel cell structure.

Figure 3:
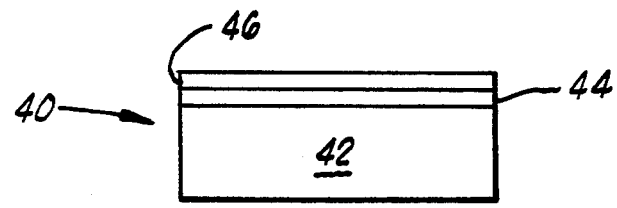
FIG. 3 is a schematic cross-section of a solid oxide fuel cell including a very thin solid oxide electrolyte and solid oxide anode layer.

FIG. 3 shows another schematic cross-sectional view of a solid oxide fuel cell 40 having cathode layer 42 in electrical contact with solid oxide electrolyte layer 44. Layer 44 is in turn in electrical contact with anode layer 46.

The use of the same crystalline phase for the solid oxide electrode and solid oxide electrolyte layers of an electrochemical cell such as a solid oxide fuel cell endows the cell with characteristics of extended life and ease of fabrication since the crystalline phase can be compositionally and, thus, structurally (i.e. with respect to lattice parameter) and functionally, (i.e. with respect to electrical and thermal expansion properties) graded to provide electrolyte and electrode layers which are assembled in a single monolithic structure without sharp interfaces existing between electrolyte and electrode layers. Such a structure also allows for fabricating a very thin electrolyte as shown schematically in FIGS. 2 and 3 thus minimizing solid electrolyte resistance which often dominates the overall resistance of the electrochemical device. Such a very thin electrolyte having minimized resistance can be structurally supported by an electrode, such as an anode or cathode as shown, respectively, in FIGS. 2 and 3, while the other electrode, respectively, the cathode or the anode is kept thin, since the structurally supporting electrode which can be porous is characterized by considerably lower resistance than the electrolyte. Resistivity in the plane of the various layers as well as resistivity perpendicular to the plane of the layers must be considered in selecting layer thickness.

According to another aspect of the invention, a method is provided for fabricating an electrochemical device which includes steps of preparing a solid electrolyte having a first crystalline phase, preparing a solid electrode characterized by the same crystalline phase and placing the solid electrolyte in electrical contact with the solid electrode.

The crystalline phase can be a solid solution having a pyrochlore, perovskite or fluorite crystal structure as already described.

The steps of preparing the solid electrode and solid electrolyte can be accomplished using ceramic processing techniques such as tape casting and powder processing. Powder processing techniques can include conventional bulk powder processing as well as "liquid-mix" techniques such as the Pechini process, as known to one skilled in the art, and can include selectively doping the crystalline phase to have a particular chemical composition to result in the desired electrical properties.

In addition, solid electrolyte and solid electrode layers can also be prepared using deposition techniques such as electrochemical vapor deposition (EVD), chemical vapor deposition (CVD), molecular beam epitaxy (MBE) or a sol-gel dipping/spinning and sintering process. For example, the solid oxide fuel cell 30 shown schematically in FIG. 2 can be prepared by tape casting anode 32 and depositing electrode layer 34 and cathode layer 36 using EVD or sol-gel dipping/spinning techniques. Graded regions 14 and 18 as shown in FIG. 1 can be prepared by repeatedly sol-gel dipping anode 20 in sol-gel solutions having slightly varying compositions to correspond to the desired spatial composition gradient of graded layers 14 and 18. Using this repeated sol-gel dipping technique, an additional dopant cation F can be introduced in the graded region so that its composition increases from essentially 0 near the solid electrolyte to a particular desired concentration at the electrode.

Suitable sol-gel solution precursors for the rare earth titanate pyrochlore crystal phase solid solution are metal alkoxides and metal beta-diketonates as are well known in the art of sol-gel fabrication.

Appropriate chemical vapor deposition (CVD) precursors useful for fabricating rare earth titanate pyrochlore crystal structure solid solution compositions are $CaCl_2$, $GdCl_3$, $TiCl_4$, $ZrCl_4$ and $O_2/H_2O$ mixtures. Graded regions 14 and 18 as shown in FIG. 1 can be prepared by varying with time e.g. the partial pressure of a CVD gaseous precursor such as $CaCl_2$ or $ZrCl_4$ to create a composition gradient as is accomplished in the production of gradient index optical fibers. High partial pressures of e.g. $CaCl_2$ will lead to high ionic conductivity while low pressures of this precursor will lead to mixed conduction.

Appropriate electrochemical vapor deposition (EVD) precursors for the rare earth titanate pyrochlore crystal structure solid solution are $CaCl_2$, $GdCl_3$, $TiCl_4$, $ZrCl_4$ and $O_2/H_2O$ mixtures. Graded regions 14 and 18 as shown in FIG. 1 can be prepared by varying with time, for example, the partial pressure of an EVD gaseous precursor such as one of those named above to create a composition gradient with a highly controlled composition profile. The EVD process further enables the fabrication of thin but dense films.

The solid oxide electrolyte can be single crystal or polycrystalline and a graded region can be produced in the solid oxide electrolyte by depositing a dopant layer on the solid oxide electrolyte and heating the solid oxide electrolyte so that the dopant layer diffuses into the solid oxide electrolyte to form a graded region.

In a preferred embodiment, the method of fabricating a graded solid oxide fuel cell can include additional steps of masking, deposition and etching to define a precise topography of active regions including electrolyte, anode, cathode, interconnect, metallization and encapsulation regions. The method of fabricating a graded solid oxide fuel cell can also include additional steps of masking the solid electrolyte surface, depositing an anode layer characterized by an anode dopant on the unmasked electrolyte surface; masking the anode layer; unmasking the electrolyte surface originally masked and depositing a cathode on that electrolyte surface.

In order to further illustrate the present invention, the following examples are provided. The particular compounds and processes and conditions utilized in the examples are meant to be illustrative of the present invention and not limiting thereto.

The following example is provided to illustrate trends in ionic conductivity, electronic conductivity and mixed ionic and electronic conductivity (MIEC) in rare earth titanate pyrochlore solid solutions which can be utilized to fabricate monolithic electrochemical devices having an electrode and electrolyte made from material having the same crystalline phase according to the invention.

EXAMPLE 1

Sample preparation of the rare earth titanate pyrochlore materials for use as solid electrodes and solid electrolytes was performed by preparing homogeneous oxide powders having the appropriate compositions followed by sintering the powders into high density compacts.

Powder preparation was conducted using a "liquid-mix" technique known to those skilled in the art as the Pechini process. Such a "liquid-mix" technique is highly desirable since it allows for preparation of a well-defined cation mole ratio with near atomic scale mixing.

According to the Pechini method, a compound of the desired metal is dissolved in a citric acid-ethylene glycol mixture. One such solution is made for each of the desired metal compounds. These solutions are then assayed and mixed in the required proportions to produce the desired oxide compound.

The mixed solutions are heated to condense the acid and alcohol groups which react via a dehydration reaction to form a crosslinked polyester.

The crosslinked polyester polymer mass is then further heated to drive off water and excess ethylene glycol and generate a hard crosslinked polymeric solid. The polymeric solid is then charred to partially burn off the organic material followed by comminution of the carbonized solid into powder. This powder is calcined at 700° C. to form the appropriate oxide with further heating, if needed, to produce the equilibrium, phase.

The solutions used included gadolinium citrate, samarium citrate, yttrium citrate and titanium citrate into which the desired quantity (in the range of from 0.0 mole % to 15.0 mole %) of $Ca^{2+}$, $Mg^{2+}$, $Sr^{2+}$ and $Al^{3+}$ dopants were introduced. It was noted that the citrate solutions were often viscous and it was then necessary to mix the solutions for several hours to ensure a homogeneous solution.

It is also noted that when the rare earth metal cations were initially supplied as nitrates, care was taken to remove the nitrate anions before dissolving the rare earth metal salts in the ethylene glycol and citric acid mixture by dissolution of the rare earth metal nitrates in water followed by precipitating the metal hydroxides with a concentrated ammonia solution.

Calcined powders were die-pressed at 5 kpsi, isopressed at 45 kpsi and sintered at 1600° C. for 16 h.

Electrical measurements were then performed on polycrystalline sintered compact bars approximately 2 mm×3 mm×8 mm with Pt electrodes in two probe configuration. Contributions from bulk, grain boundary, and electrodes were deconvoluted using complex impedance spectroscopy. An HP4192A impedance analyzer with a frequency range of 5 Hz to 13 MHz was used for the analysis. Measurements were made as a function of temperature (800°-1110° C. and oxygen fugacity ($1-10^{-20}$ atm) using either pre-mixed oxygen/argon or carbon dioxide/carbon monoxide mixtures. The oxygen fugacity was periodically checked with a stabilized zirconia galvanic cell.

The effects of aliovalent doping on ionic, electronic and mixed ionic and electronic conductivity (MIEC) were investigated in the rare earth titanate pyrochlore solid solution end member $Gd_2Ti_2O_7$ to evaluate the role of host lattice, dopant site and dopant-host size mismatch on electrical transport.

Figure 4:
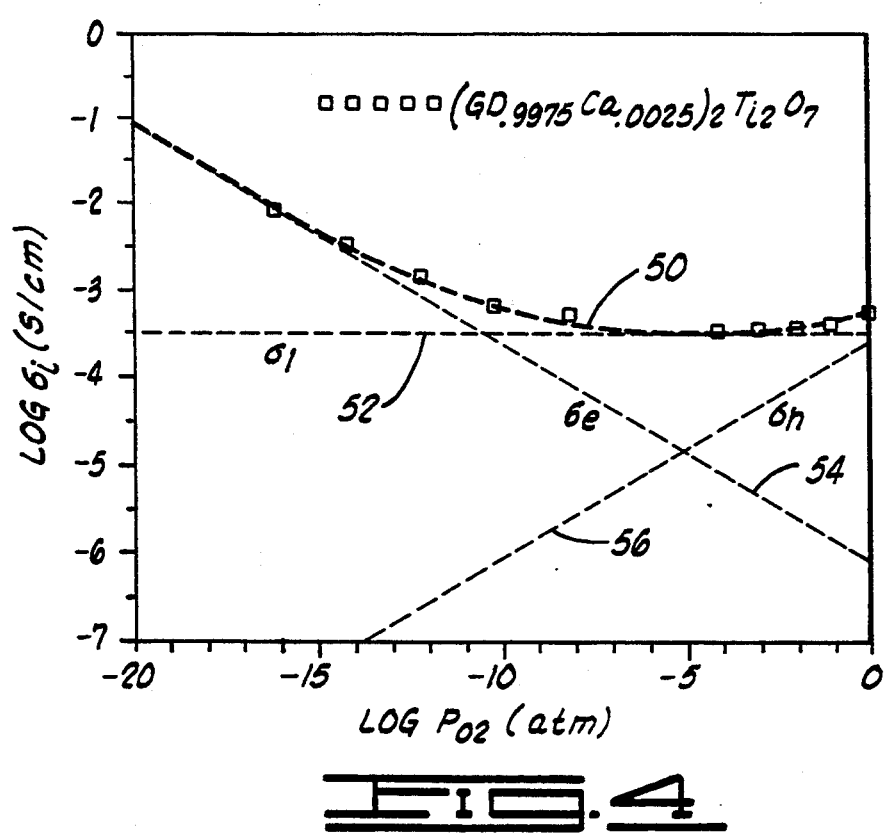
FIG. 4 is a plot of log $\sigma$ versus log $P_{O2}$ for $(Gd_{0.9975}Ca_{0.0025})_2Ti_2O_2$ at 1000° C.

FIG. 4 shows the isothermal log a versus log $P_{O2}$ observed for the pyrochlore composition $(Gd_{0.9975}Ca_{0.0025})_2Ti_2O_7$ at 1000° C. and is representative of $A_2Ti_2O_7$ pyrochlores where A is Sm, Gd and Y. In FIG. 4, solid line 50 is an iterative least squares minimization technique fit of the data for the total measured conductivity to defect chemistry theory and dashed lines 52, 54 and 56, respectively, show the individual contributions of $\sigma_i$, $\sigma_e$ and $\sigma_h$ where $\sigma_i$, $\sigma_e$, $\sigma_h$ respectively are the ionic, the n-type and the p-type contributions to the total measured conductivity.

Figure 5:
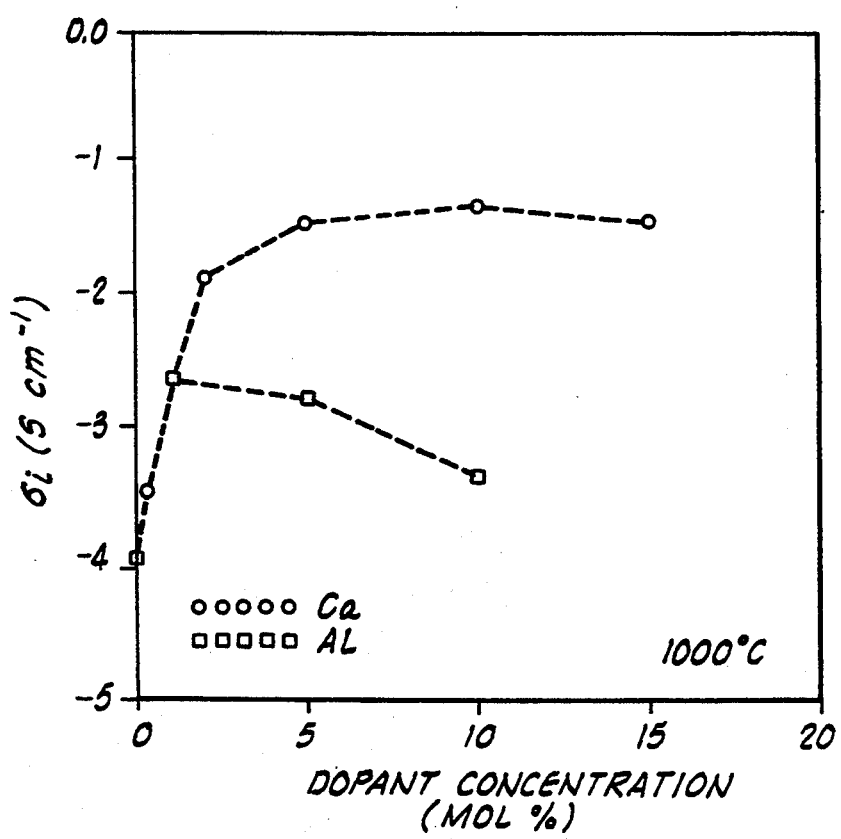
FIG. 5 is a plot of ionic conductivity $\sigma_i$ as a function of $Ca^{2+}$ and $Al^{3+}$ doping in $Gd_2Ti_2O_7$ at 1000° C.
Figure 6:
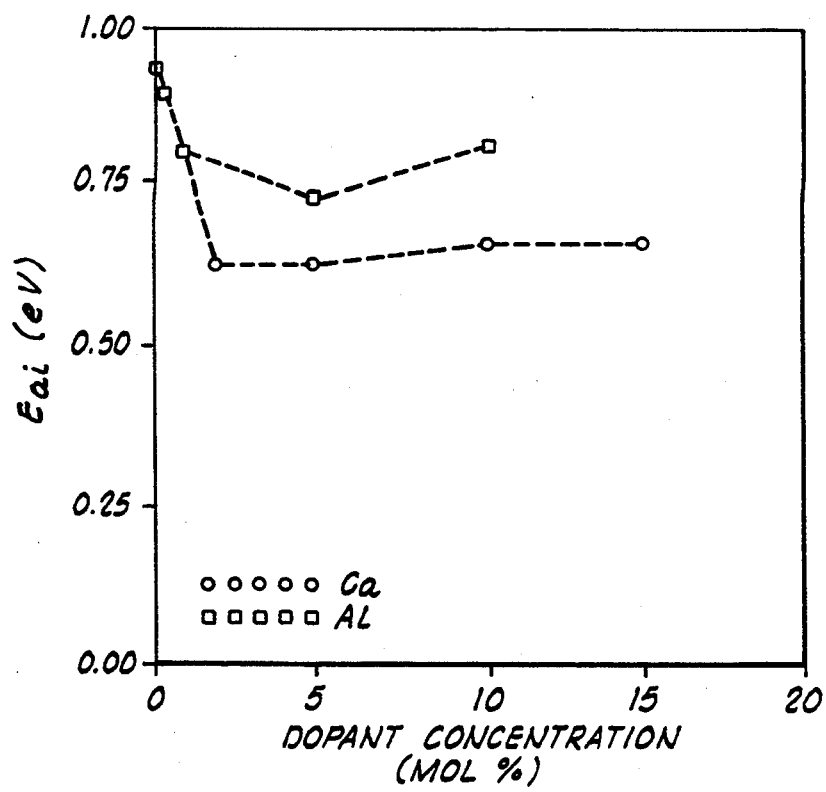
FIG. 6 is a plot of the ionic conductivity activation energy as a function of $Ca^{2+}$ and $Al^{3+}$ doping in $Gd_2Ti_2O_7$.

FIG. 5 and FIG. 6, respectively, show the ionic conductivity and corresponding activation energy for ionic conduction as a function of divalent $Ca^{2+}$ acceptor doping to partially replace $Gd^{3+}$ on the "A site" and as a function of trivalent $Al^{3+}$ acceptor doping on the $Ti^{4+}$ site. It is noted that the activation energy for ionic conduction, $E_{ai}$, is a function of dopant concentration and drops to a minimum value of 0.63 ev for 5.0 mole % Ca doping.

FIGS. 5 and 6 show that the ionic conductivity of $Gd_2Ti_2O_7$ at 1000° C. can be increased by over 2.5 orders of magnitude by doping with divalent $Ca^{2+}$ which reduces $E_{ai}$ from 0.93 ev to 0.63 ev. For $Al^{3+}$ doping, a sharp maximum in $\sigma_i$ is observed at approximately 1 mole % Al which may be due to the limited solubility of Al on the Ti site.

Figure 7:
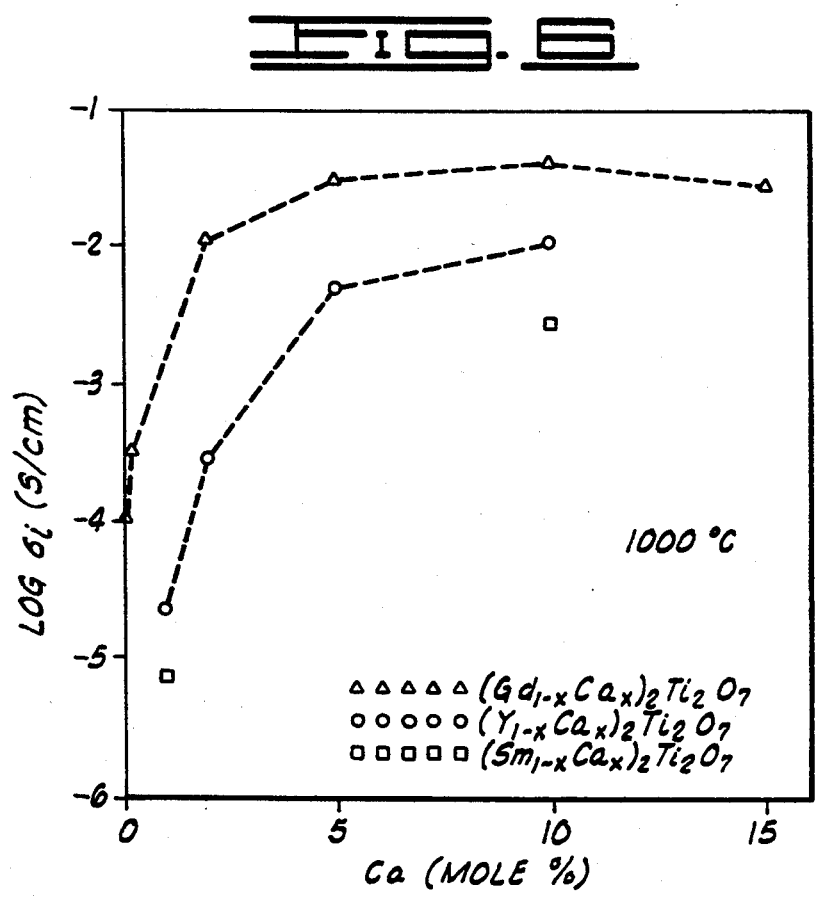
FIG. 7 is a plot of log $\sigma_i$ showing the effect of dopant chemical identity and concentration on $\sigma_i$ in samarium, gadolinium and yttrium-based rare earth titanates.

FIG. 7 shows that $Y_2Ti_2O_7$ and $Sm_2Ti_2O_7$ also have high solubilities for $Ca^{2+}$ and further demonstrates that the $Ca^{2+}$ doped gadolinium titanate has the highest ionic conductivity when compared to those of yttrium and samarium titanates having the same $Ca^{2+}$ doping levels.

Figure 8:
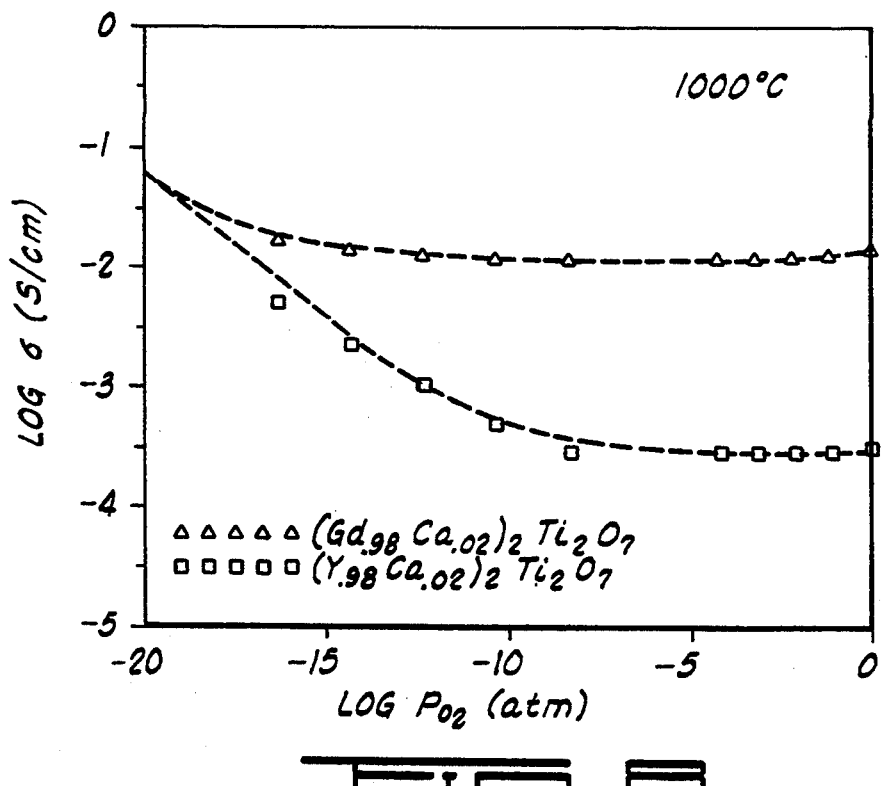
FIG. 8 is a plot showing log versus log $P_{O2}$ isotherms at 1000° C. for $Ca^{2+}$ doped yttrium- and gadolinium-based titanates.
Figure 9:
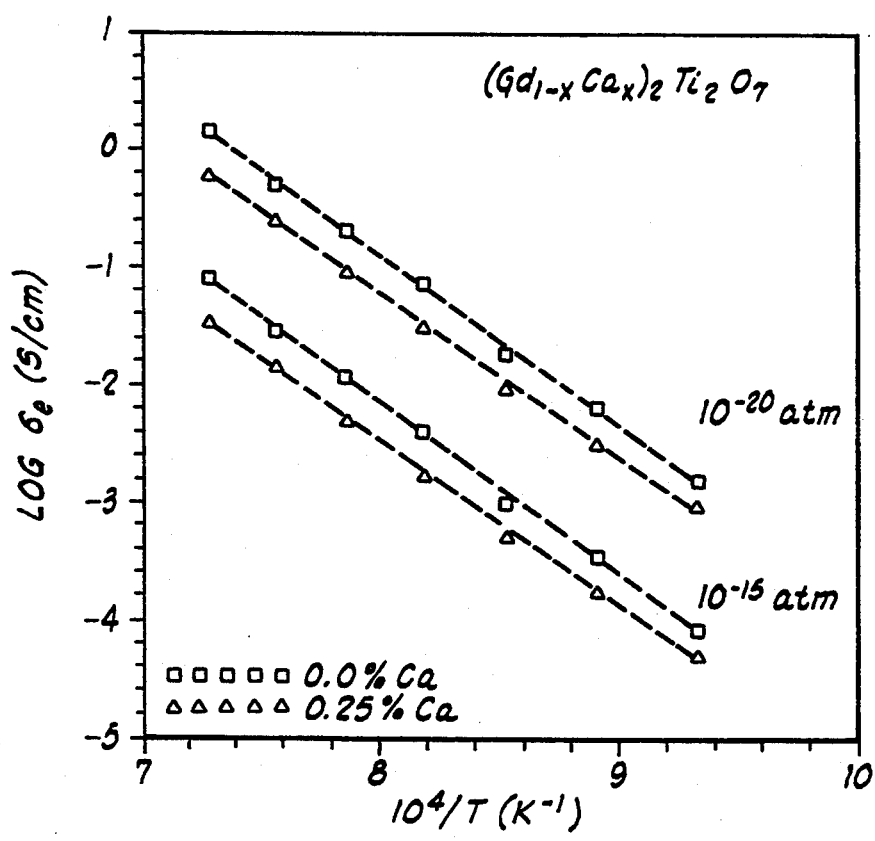
FIG. 9 is a plot of log $\sigma_e$ where $\sigma_e$ is the n-type electronic conductivity as a function of inverse temperature showing high electronic conductivity at low $P_{O2}$ in $(Gd_{1-x}Ca_x)_2Ti_2O_7$.

In FIG. 8, log $\sigma$ isotherms versus log $P_{O2}$ for $(A_{0.98}Ca_{0.02})_2Ti_2O_7$ where A is Y or Gd indicated that at high $P_{O2}$ the ionic conductivity dominates over the electronic conductivity. With decreasing $P_{O2}$, a much stronger increase in mixed ionic and electronic conductivity (MIEC) is observed in the $Y_2Ti_2O_7$ based rare earth titanate than in the $Gd_2Ti_2O_7$ based material. FIG. 9 shows the high electronic conductivity achieved in $(Gd_{1-x}Ca_x)_2Ti_2O_7$ at low $P_{O2}$.

Figure 10:
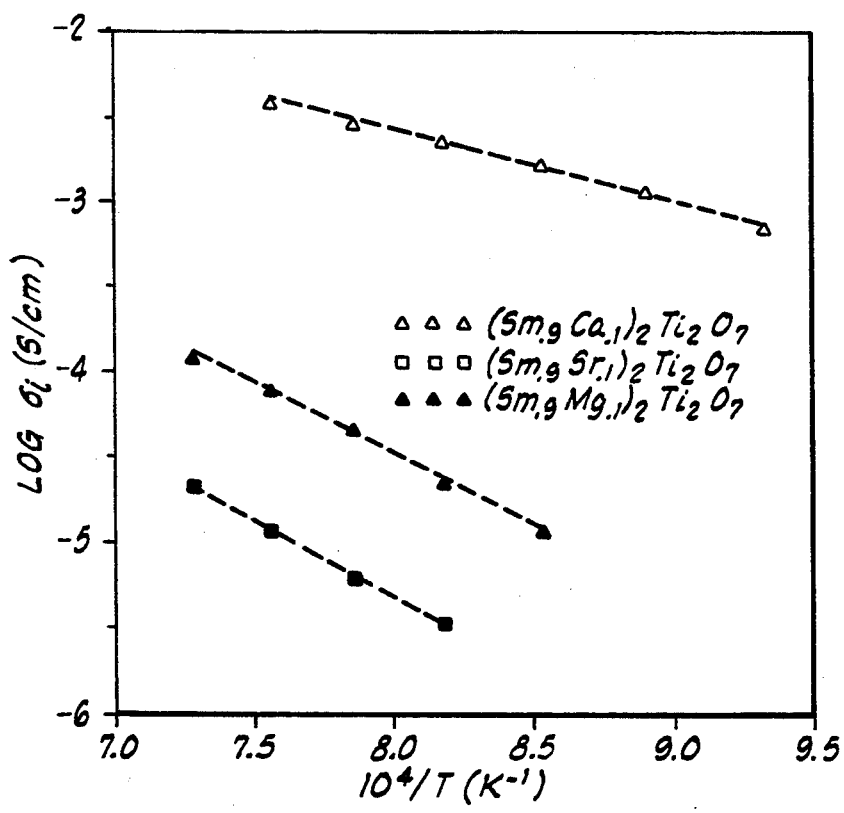
FIG. 10 is a plot of log $\sigma_i$ as a function of inverse temperature comparing the ionic conductivity of a samarium based titanate doped with divalent cations of differing cationic radii.
Figure 11:
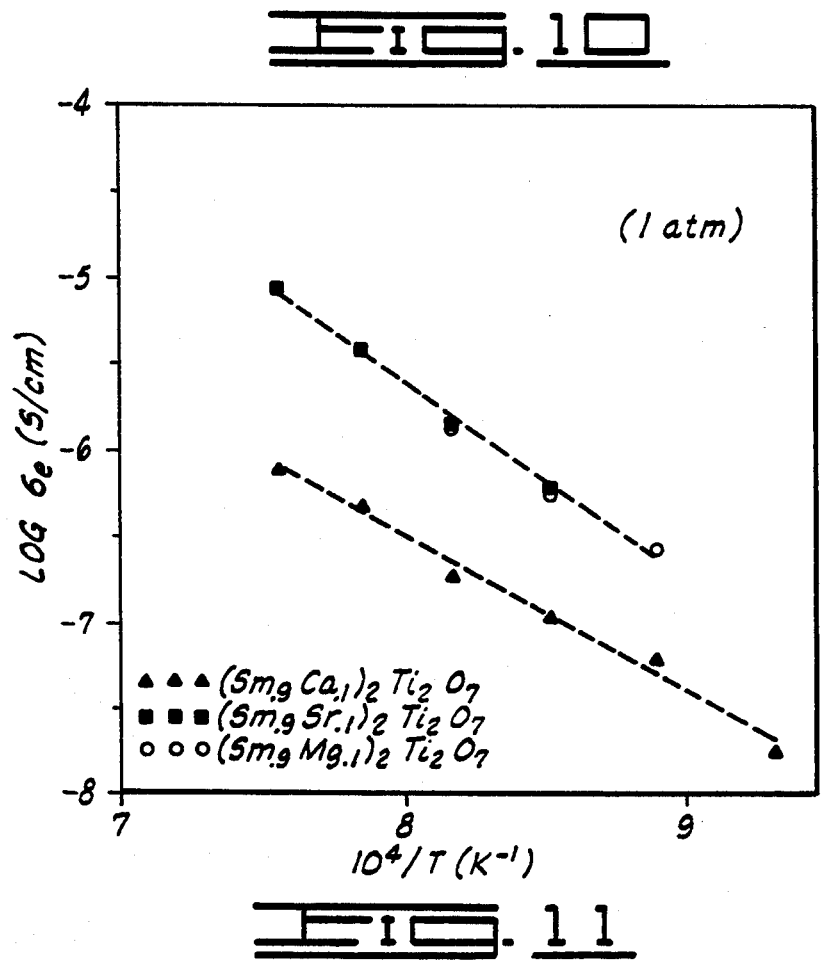
FIG. 11 is a plot of log $\sigma_e$ as a function of inverse temperature comparing the ionic conductivity of a samarium-based titanate doped with divalent cations of differing cationic radii.
Figure 12:
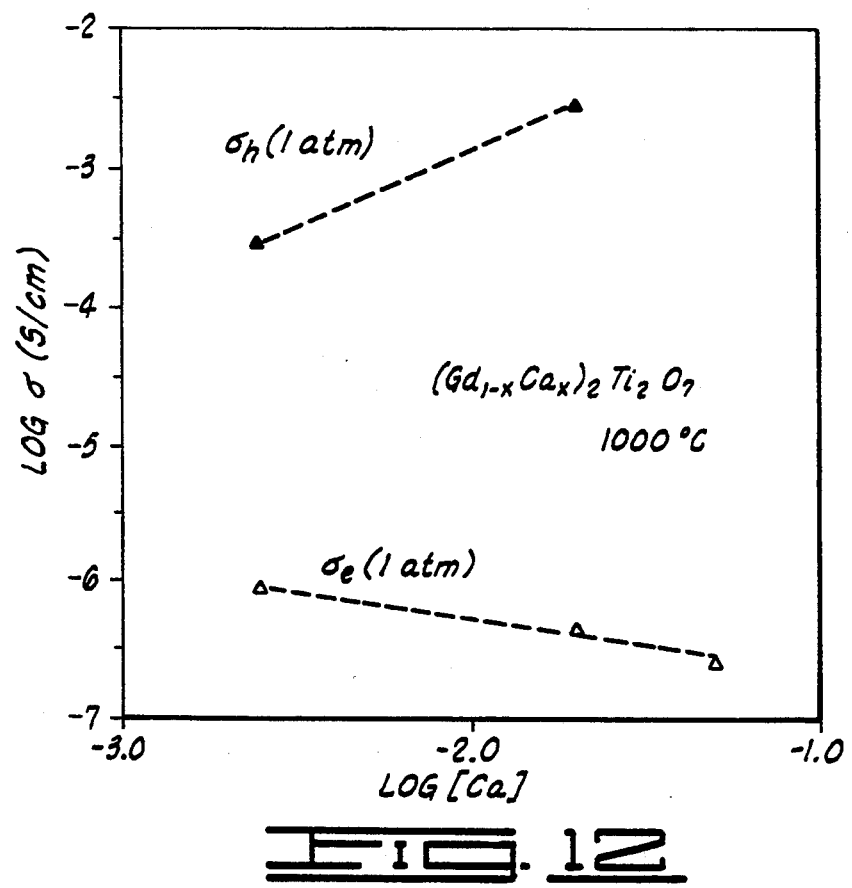
FIG. 12 is a plot showing electron and hole conductivity as a function of $Ca^{2+}$ doping in $(Gd_{1-x}Ca_x)_2Ti_2O_7$ at 1000° C.

FIG. 10 shows the temperature dependence of $\sigma$ for $(Sm_{0.9}R_{0.1})_2Ti_2O_7$ where R is a $Sr^{2+}$, $Ca^{2+}$ and $Mg^{2+}$ dopant which although isovalent is characterized by variable cationic size. Between 800°-1100° C., the intermediate $Ca^{2+}$ dopant is associated with the highest ionic conductivity, due in part to the fact that the $Ca^{2+}$ cationic radius of 1.12 Angstroms is closest in size among those of the three dopants to that of $Sm^{3+}$ (1.09 Angstroms) as well as to dopant solubility and defect association effects. By contrast, as shown in FIG. 11, $Sr^{2+}$ and $Mg^{2+}$ doped compositions had higher electronic conductivities than those doped with $Ca^{2+}$. FIG. 12 shows the electron hole conductivity as a function of Ca doping in $(Gd_{1-x}Ca_x)_2Ti_2O_7$ with $\sigma_e$ and $\sigma_h$ decreasing and increasing, respectively, with increasing Ca content. At $P_{O2}=10^{-20}$ atm, $\sigma_e$ and $\sigma_h$, the p-type electronic conductivity are, respectively, increased and decreased by approximately five orders of magnitude relative to the $P_{O2}$ 1 atm values.

Figure 13:
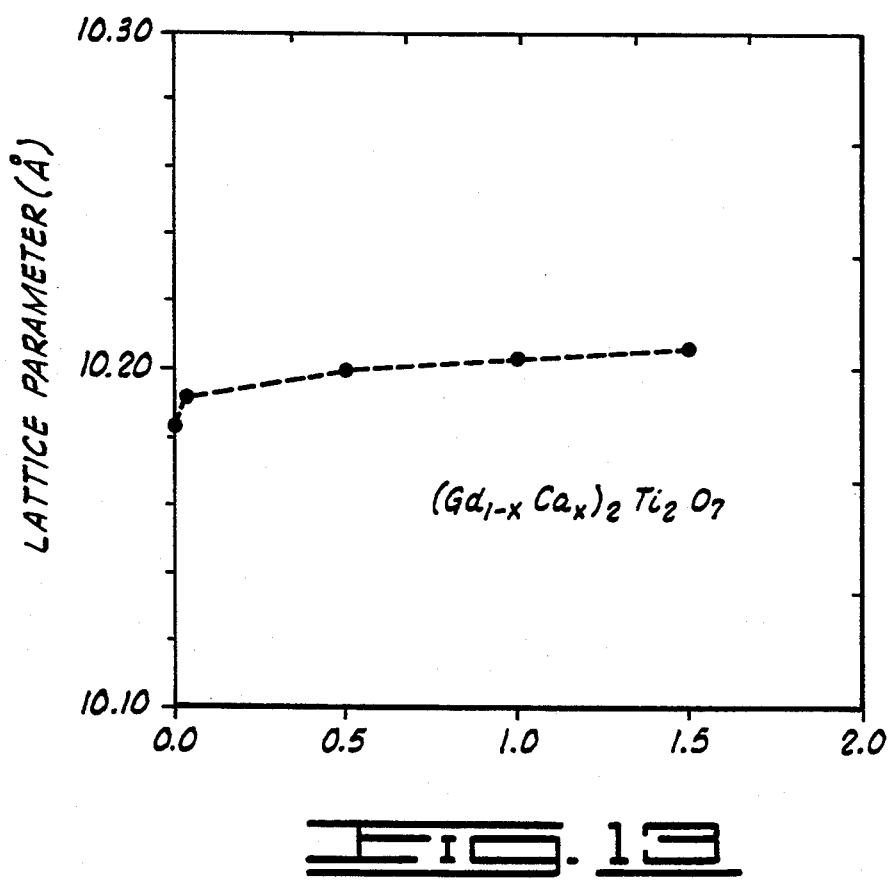
FIG. 13 is a plot of lattice parameter of $(Gd_{1-x}Ca_x)_2Ti_2O_7$ a function of $Ca^{2+}$ doping.

FIG. 13 shows the variation in lattice parameter in the gadolinium-based rare earth titanate system with Ca doping indicating that as much as 15% A-site fraction Ca dopant can be incorporated in the gadolinium-based rare earth titanate with only minimal lattice parameter mismatch which thus minimizes mechanical strain at the interface between layers having different Ca doping levels in a monolithic electrochemical apparatus.

EXAMPLE 2

The following example is provided to indicate how a Ru doped gadolinium titanate for use as a mixed ionic electronic conductor (MIEC) electrode in an electrochemical apparatus of the invention is prepared and characterized.

Ruthenium chloride was added directly to a solution of citric acid in ethylene glycol to which acetic acid has been previously added to lower the pH to approximately 4 to yield a reddish-brown translucent stock solution which was then assayed as a next step in the "liquid-mix" process as already described.

This ruthenium citrate stock solution was then added to gadolinium citrate and titanium citrate stock solutions in proportions calculated to produce compounds of the formula $(Gd_2Ru_xTi_{1-x})_2O_7$ wherein Ru is believed to substitute on the Ti site.

The mixed solutions were then pyrolyzed to form a hardened resin, baked at 550° C in air and calcined only to 750° C. in air. A lower calcination temperature is necessary to prevent loss of Ru through formation of $RuO_4$ which is produced at temperatures of about 800° C. to about 850° C. in oxidizing environments.

Sintered pellets of Ru-substituted gadolinium titantate were prepared by forming a thick slurry containing 2 wt % polyvinyl-alcohol, 2 wt % polyethylene glycol binder, water and powder. The slurry was dried, ground with a mortar and pestle and sieved to remove particles larger than $-120$ mesh. The sieved powder was then pressed uniaxially to 5 kpsi, sanded and pressed isostatically to 40 kpsi. The pressed pellets were then heated to 750° C. to remove the binder. The pressed pellets were finally sintered in a highly reducing environment, forming gas, 5% $H_2$ in 95% $N_2$, at 1600° C. for 12 hours. The highly reducing environment is need to avoid the loss of Ru through formation and chemical vapor transport of $RuO_4$. Sintered pellets were highly colored red, reddish-purple or black with darker colors associated with higher Ru contents.

The x-ray diffraction patterns from crushed pellets showed that they were the pyrochlore crystalline phase with the same structure but slightly different lattice parameter than the $Gd_2Ti_2O_7$ undoped composition.

Electrical conductivity measurements were made on the Ru-doped samples and the data deconvolved to isolate the bulk contribution to the conductivity from grain boundary and electrode interfacial effects.

Figure 14:
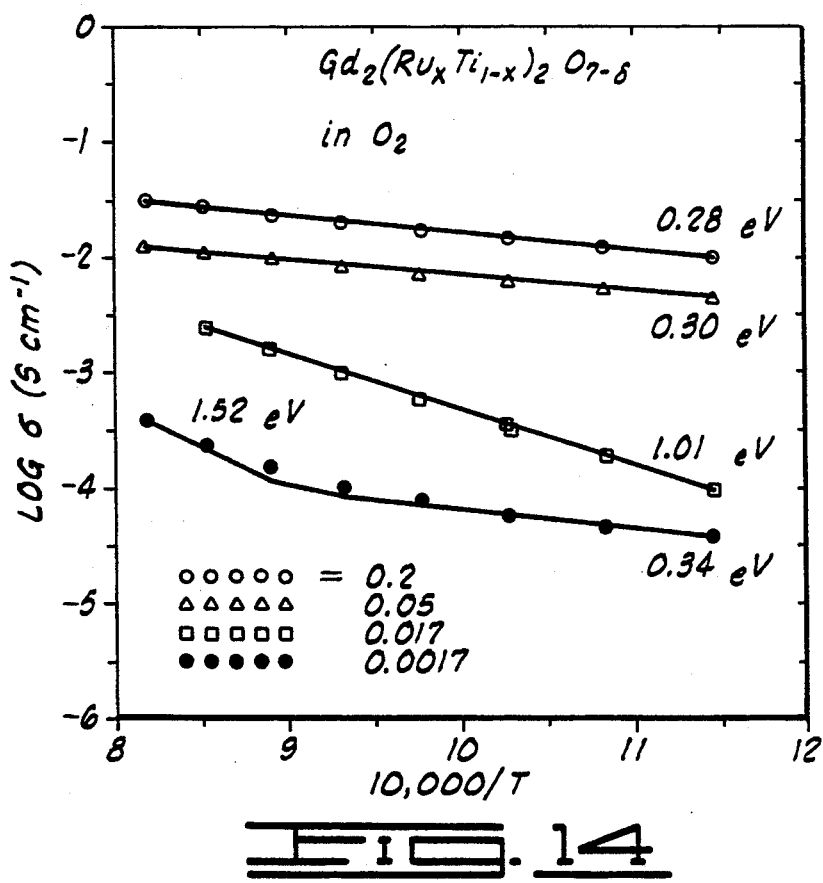
FIG. 14 is a plot of log $\sigma$ versus inverse temperature for several Ru-doped gadolinium titanate compositions.

FIG. 14 shows how samples with high Ru content ($x \geq 0.02$) exhibit high conductivities with low activation energies. Samples with lower Ru content have higher activation energies and are less conductive.

Figure 15:
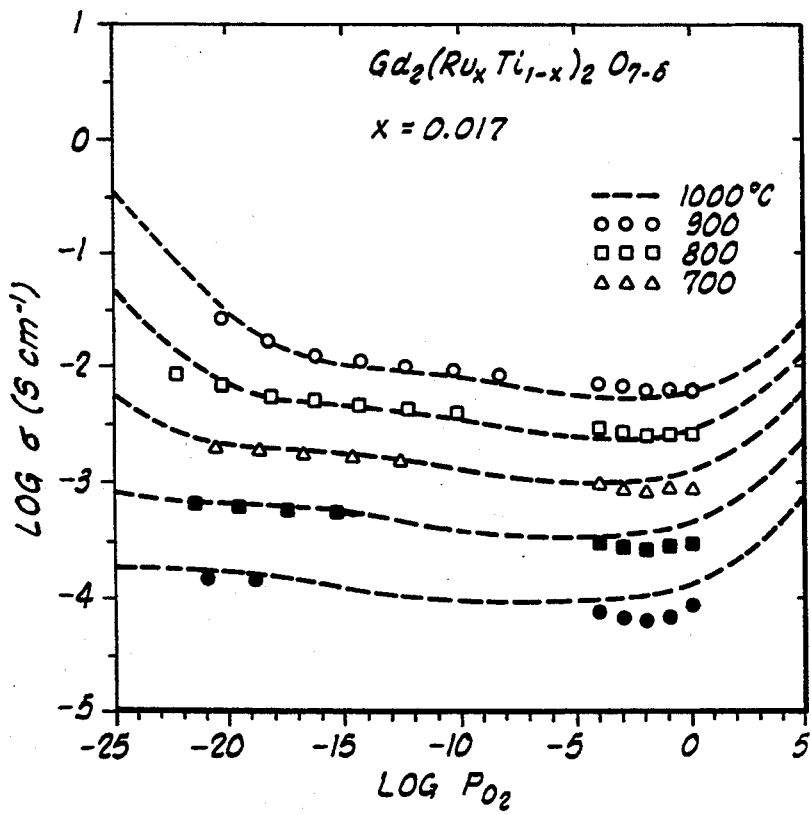
FIG. 15 is a plot of measured total conductivity for a $Gd_2(Ru_xTi_{1-x})_2O_{7-\delta}$ as a function of log $P_{O2}$ for x=0.017.

FIG. 15 shows the effect of variation in $P_{O2}$ on the measured conductivity of Ru-doped gadolinium titanate. A nearly $P_{O2}$ independent regime typically occurs in Ru doped gadolinium titantate with $x \leq 0.02$ at elevated temperatures and high $P_{O2}$ indicating that, at low concentration, Ru acts as an acceptor. The activation energies of 0.8 to 1 ev and the magnitudes of the conductivities ($\sigma = 3 \times 10^{-2}$ at 1000° C.) are typical of ionic conduction found in Ca doped gadolinium titantate. For $x \geq 0.05$, the low temperature conductivity increases by orders of magnitude and the activation energy drops to 0.2 to 0.3 ev, indicating a shift from ionic to predominantly electronic conductivity. Since this conductivity increases with decreasing $P_{O2}$, it is probably not p-type.

The implications for the use of gadolinium titanate ruthenate solid solution as a solid oxide electrode in an electrochemical apparatus are enhanced electrode kinetics due to the well known catalytic effects of Ru and the enhanced mixed ionic-electronic conductivity of the $Gd_2Ti_2O_7$—$Gd_2Ru_2O_7$ solid solution. The single phase nature of the electrode-electrolyte monolithic structure adds to the stability of the system.

More specifically, the implications for the use of gadolinium titanate ruthenate solid solution in a solid oxide fuel cell are lower operating temperatures due to the enhanced electrode kinetics and the possibility of forming thin electrolyte layers in a monolithic composite structure. Since metallic conductivity can be achieved in a $(Bi_{1-x}Gd_x)_2(Ti_{1-y}Ru_y)_2O_7$ solid solution, as well as high ionic conductivity, a fuel cell with low operating temperatures and structural and electrical compatibility can be fabricated which will lead to high energy conversion efficiency and long operating life for the electrochemical apparatus.

EXAMPLE 3

The following example is provided to show the preparation and characterization of a multilayer composite structure including two functionally different pyrochlore compositions which may be co-fired to give a structurally robust composite structure without destroying the electrical characteristics of the individual layers.

A three layer electrochemical device was fabricated from two compositions based upon $Gd_2Ti_2O_7$. The first composition, composition A, $(Gd_{0.9}Ca_{0.1})_2Ti_2O_7$ is an excellent ionic conductor ($\sigma = 5 \times 10^{-2}$ S/cm at 1000° C.) and the second composition, composition B, $(Gd_{0.9975}Ca_{0.0025})_2Ti_2)O_7$ is a mixed ionic-electronic conductor with an ionic conductivity of approximately $3 \times 10^{-4}$ S/cm at 1000° C. and electronic conductivity of approximately $10^{-2}$ S/cm at 1000° C. and $P_{O2} = 10^{-16}$ atm.

The composite structure was fabricated by successively filling a steel die of diameter $\frac{3}{4}"$ with powders of compositions A, B and A. Amounts of 1 gm composition A and 2.5 gm composition B were used. Subsequent to adding each of the sequential powder layers, a piston was inserted and pressed by hand to flatten the previous layer. The composite was then further compacted in a uniaxial press at 5 kpsi. After removal from the die, the pellet was isostatically pressed at 50 kpsi followed by sintering in air at 1600° C. for 18 hours. The specimen was then furnace cooled to room temperature. Sintering yielded a high density pellet characterized by greater then 90% theoretical density with two thin outer regions distinguished only by a yellow tint as compared to the white interior. No cracks or delamination of the layers was observed.

Figure 16:
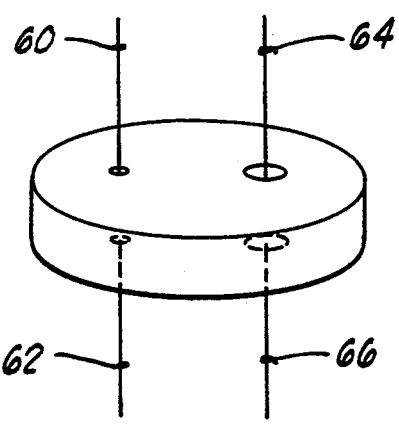
FIG. 16 is a schematic elevation view of a multilayer composite electrochemical apparatus of the invention.
Figure 17:
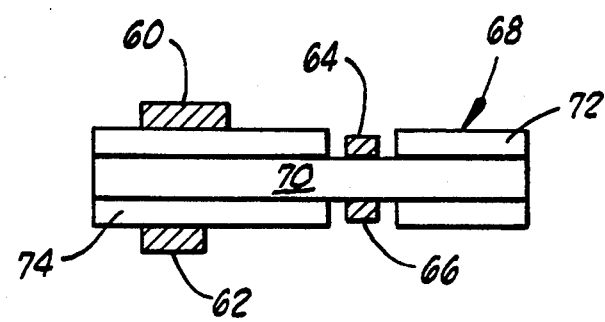
FIG. 17 is a schematic cross-section of a multilayer composite electrochemical apparatus of the invention.

The layered composite was electrically characterized to demonstrate that the respective layers retained their individual electrical characteristics. A core drill was used to bore $\frac{1}{4}"$ diameter holes through the outer layers to enable electrical contact to be made to the inner as well as to the outer layers of the multilayer composite as shown schematically in an elevation view in FIG. 16 and in cross-section in FIG. 17. Four contacts, 60, 62, 64 and 66 allow measurement of the electrical properties of all layers. Contacts 60 and 62 allow measurement of the overall composite 68. Contacts 64 and 66 allow measurement of inner layer 70. Contacts 60 and 62 and 62 and 66 allow measurement of outer layers 72 and 74, respectively.

Using AC complex impedance methods, in $P_{O2} = 1$ atm, at 900° C., $R_{60\text{-}62} = 83$ k$\Omega$; $R_{64\text{-}66} = 85$ k$\Omega$; $R_{60\text{-}64} = 1.8$ k$\Omega$. As expected based on the layer individual properties, layers 72 and 74 were much less resistive than layer 70 and therefore, within experimental error, the overall resistance of the multilayer composite was equal to that of the most resistive layer 70.

Additional measurements conducted at $P_{O2}=10^{-4}$ atm and at 900° C. gave $R_{60-62}=21$ k$\Omega$; $R_{64-66}=22$ k$\Omega$ and $R_{60-64}=1.8$k$\Omega$. As expected based upon the individual properties of the layers, layers 72 and 74 being predominantly ionically conductive exhibited no $P_{O2}$ dependence, while layer 70 showed the decrease in resistance characteristic of a mixed ionic electronic conductor where n-type conductivity increases with decreasing $P_{O2}$.

What is claimed is:

1. An electrochemical apparatus comprising:
   (1) a solid electrolyte made of solid electrolyte material characterized by a solid electrolyte crystalline phase including a first solid solution further including a first primary component; and
   (2) a solid electrode made of solid electrode material characterized by a solid electrode crystalline phase which is the same as said solid electrolyte crystalline phase and in electrical contact with said solid electrolyte including a second solid solution including a second primary component wherein said second primary component has a different chemical composition than said first primary component.

2. The apparatus of claim 1 wherein said solid electrolyte is further characterized by a solid electrolyte lattice constant and said solid electrode is further characterized by a solid electrode lattice constant and said solid electrolyte lattice constant and said solid electrode lattice constant are characterized by a lattice constant mismatch in the range of from about 0.1% to about 5%.

3. The apparatus of claim 1 wherein said solid electrolyte is characterized by an ionic conductivity activation energy in the range of from about 1.5 ev to about 0.5 ev.

4. The apparatus of claim 1 wherein said solid electrode is further characterized by a mixed ionic electronic conductivity and has an ionic conductivity in the range of from about $10^{-3}$ S/cm to about 1 S/cm and an electronic conductivity in the range of from about $10^{-3}$ S/cm to about $10^3$ S/cm.

5. The apparatus of claim 1 further comprising a solid interconnect characterized by an electronic conductivity in the range of from about 1 S/cm to about $10^3$ S/cm.

6. The apparatus of claim 1 wherein said crystalline phase is a solid solution further including a first cation having a first cation valence occupying a first cation lattice and a second cation having a second cation valence occupying a second cation lattice and wherein said first cation lattice and said second cation lattice each accommodate substitution of a third cation characterized by a third cation valence different from said first cation valence and from said second cation valence and further characterized by composition dependent electrical properties including ionic conductivity, electronic conductivity and mixed ionic and electronic conductivity.

7. The apparatus of claim 6 wherein said solid solution is characterized by a formula $(A_{1-j}D_j)_x(B_{1-k}E_k)_yO_zX_w$ wherein A is a cation of an element selected from the group consisting of Ca, Sr, Ba, Sc, Y, La, Ce, Pr, Nd, Sm, Eu, Gd, Tb, Dy, Ho, Er, Tm, Yb, Lu, Tl, Pb, Bi, Pm and mixtures thereof: B is a cation of an element selected from the group consisting of Al, Cr, Mn, Fe, Co, Ni, Cu, In, Ti, Zr, Hf, Sn, Pb, Ru, Os, Ir, Rh, Pd, Pt, Sb, V, Nb, Ta, Mo, W and mixtures thereof; D is a cation of an element selected from the group consisting of Na, K, Ca, Sr, Ba, Sc, Y, La, Ce, Pr, Nd, Sm, Eu, Gd, Tb, Dy, Ho, Er, Tm, Yb, Lu, Tl, Pb, Bi and Pm; E is a cation of an element selected from the group consisting of Al, Sc, Cr, Mn, Fe, Co, Ni, Cu, In, Ti, Zr, Hf, Sn, Pb, Ru, Os, Ir, Rh, Pd, Pt, Sb, V, Nb, Mo, W and Ta; O is oxygen; X is an anion selected from the group consisting of S, N, F, Cl, and OH anions; x is in the range of $0 \leq x < 5$; j is in the range $0 \leq j < 1$; y is in the range $0 < y < 5$; k is in the range $0 \leq k < 1$; z is in the range $2 < z < 11$; w is in the range $0 \leq w < 1$; and x, j, y, k, z, and w are selected to satisfy overall electroneutrality conditions for said formula.

8. The apparatus of claim 7 wherein said solid solution is a solid solution having a perovskite crystal structure and characterized by the formula $ABO_{3-\delta}$ wherein A is an A cation of an element selected from the group consisting of Ba, Sr, La, Ca, Pb and Bi; B is selected from the group consisting of Sr, Mn, Cu, Fe, Ti, Zr, Co, Ni, In, Zn, Sc, Ta, Nb and Al and $\delta$ is in the range of from 0 to 3.

9. The apparatus of claim 8 wherein said A cation is further characterized by an A cation valence and is partially replaced by a third dopant cation characterized by a third dopant cation valence which is lower than said A cation valence and is a third dopant cation of an element selected from the group consisting of K, Ca, Sr, Mg and Na to increase ionic conductivity of said solid electrolyte.

10. The apparatus of claim 8 wherein in said formula $ABO_{3-\delta}$ B is replaced by a lower valent cation of an element selected from the group consisting of Al, Zn, Mg, In and Sc to increase ionic conductivity of said solid electrolyte.

11. The apparatus of claim 8 wherein in said formula $ABO_{3-\delta}$, B is partially replaced by a donor cation selected from the group consisting of $Nb^{5+}$, $Ta^{5+}$, $W^{6+}$, $V^{5+}$ and $Mo^{6+}$ to increase electronic conductivity of said solid electrolyte.

12. The apparatus of claim 8 wherein in said formula $ABO_{3-\delta}$, A is partially replaced by a donor cation selected from the group consisting of trivalent rare earth cations, $Th^{4+}$, $Pr^{4+}$, $Tb^{4+}$, $V^{5+}$ and $La^{3+}$ to increase electronic conductivity of said solid electrolyte.

13. The apparatus of claim 8 wherein in said formula $ABO_{3-\delta}$, B is replaced with a second acceptor dopant cation to increase simultaneously ionic conductivity and electronic conductivity of said solid electrode and said second variable valence acceptor dopant is selected from an element of the group consisting of Fe, Co, Ni, Cr, Mn, Cu, Os, Ir, Rh, Pt, Pd, Re and Ru.

14. The apparatus of claim 7 wherein said solid solution is a solid solution having a fluorite crystal structure and characterized by the formula $A_{1-j}D_jO_{2\pm\epsilon}$ wherein A is an A cation of an element selected from the group consisting of Ce, Pr, Hf and Th, and D is a D cation of an element selected from the group consisting of Ce, Pr and Tb; and s indicates the extent of oxygen deficiency or excess relative to two oxygens per formula unit and s is in the range of from about 0 to about ±0.3.

15. The apparatus of claim 14 wherein said A cation is further characterized by an A cation valence and is partially replaced by a fourth dopant cation characterized by a fourth dopant cation valence which is lower than said A cation valence and is selected from the group consisting of Y, Ca, Mg, Gd, Nd, La and rare earth elements having trivalent cations to increase ionic conductivity of said solid electrolyte.

16. The apparatus of claim 14 wherein said A cation is further characterized by an A cation valence and is partially replaced by a fifth dopant cation having a fifth dopant cation valence higher than said A cation valence wherein said fifth cation is a cation of an element selected from the group consisting of U, Ta and Nb to increase electronic conductivity of said solid solution.

17. The apparatus of claim 14 wherein in said formula $A_{1-j}D_jO_{2\pm\epsilon}$, D is selected to provide an impurity band having the characteristics of an acceptor impurity band to simultaneously increase ionic conductivity and electronic conductivity of said solid electrode and said D cation is a cation of an element selected from the group consisting of Ce, Pr and Tb.

18. The apparatus of claim 7 wherein said solid solution is a solid solution having a fluorite crystal structure and characterized the formula $A_{1-j}D_jO_{2\pm\epsilon}$ wherein A is an A cation of an element selected from the group consisting of Ce, Pr, Hf and Th, and D i cation of an element selected from the group consisting of Ce, Pr and Tb; and s indicates the extent of oxygen deficiency or or excess relative to two oxygens per formula unit and $\epsilon$ is in the range of from about 0 to about 0.1.

19. The apparatus of claim 7 wherein said solid solution is a solid solution having a fluorite crystal structure and characterized by the formula $A_{1-j}D_jO_{2\pm\epsilon}$ wherein A is an A cation of an element selected from the group consisting of Ce, Pr, Hf and Th, and D is a D cation of an element selected from the group consisting of Ce, Pr and Tb; and $\epsilon$ indicates the extent of oxygen deficiency or excess relative to two oxygens per formula unit and $\epsilon$ is in the rang of from about 0 to about 0.03.

20. The apparatus of claim 7 wherein said solid solution is a titanate solid solution having a pyrochlore crystal structure and characterized by the formula $A_2Ti_2O_{7-\delta}$ wherein A is an A cation of an element selected from the group consisting of Sm, Gd, Ho, Ce, Pr, Nd, Pm, Eu, Tb, Dy, Er, Tm, Yb, Lu, Y, Sc, Bi, Pb and mixtures thereof and wherein $\delta$ indicates the extent of oxygen deficiency or excess relative to seven oxygens per formula unit and is in the range of from about $\pm 0.001$ to about $\pm 0.3$.

21. The apparatus of claim 20 wherein said A cation is a $Gd^{3+}$ cation.

22. The apparatus of claim 20 wherein said A cation is further characterized by an A cation valence and is partially replaced by a first dopant cation characterized by a first dopant cation valence which is lower than said A cation valence.

23. The apparatus of claim 22 wherein said first dopant cation is a $Ca^{2+}$ cation and said titanate solid solution is further characterized by the formula $(Gd_{1-j}Ca_j)_2Ti_2O_{7-\delta}$; j is in the range of from about 0 to about 0.25 and $\delta$ is approximately equal to j to increase ionic conductivity of said solid electrolyte.

24. The apparatus of claim 22 wherein said first dopant cation is an $Al^{3+}$ cation and said titanate solid solution is further characterized by the formula $(Gd_2(Ti_{1-k}Al_k)_2O_{7-\delta}$; k is in the range of from about 0 to about 0.05 and $\delta$ is approximately equal to k to increase ionic conductivity of said solid electrolyte.

25. The apparatus of claim 20 wherein said A cation is partially replaced by a smaller, isovalent cation selected from the group consisting of $Dy^{3+}$, $Y^{3+}$ and $Ho^{3+}$ to increase ionic conductivity of said solid electrolyte.

26. The apparatus of claim 20 wherein in said formula $A_2Ti_2O_{7-\delta}$, Ti is partially replaced by a larger, isovalent cation selected from the group consisting of $Zr^{4+}$, $Sn^{4+}$ and $Hf^{4+}$ to increase ionic conductivity of said solid electrolyte.

27. The apparatus of claim 20 wherein in said formula $A_sTi_2O_{7-\delta}$, Ti is replaced by a donor cation selected from the group consisting of $Nb^{5+}$, $W^{6+}$, $Mo^{6+}$, $Ta^{5+}$ and $V^{5+}$ to increase electronic conductivity of said solid solution.

28. The apparatus of claim 20 wherein said A cation is further characterized by an A cation valence and is partially replaced by a second dopant cation having a second dopant cation valence higher than said A cation valence.

29. The apparatus of claim 28 wherein said second dopant cation is selected from the group consisting of $Th^{4+}$, $U^{5+}$, $Ce^{4+}$, $Pr^{4+}$ and $Tb^{4+}$ to increase electronic conductivity of said solid solution.

30. The apparatus of claim 20 wherein in said formula $A_2TiO_{7-\delta}$, Ti is partially replaced with a variable valence acceptor dopant cation to simultaneously increase ionic conductivity and electronic conductivity of said solid solution.

31. The apparatus of claim 30 wherein said acceptor dopant cation is a cation of an element selected from the group consisting of Ru, Os, Ir, Rh, Pd, Pt, Re, Mn, Fe, Co, Ni and Cr present in said apparatus in sufficient concentration to form an impurity band.

32. The apparatus of claim 1 wherein said crystalline phase is a solid solution further including a first cation having a first cation size occupying a first cation lattice and a second cation having a second cation size occupying a second cation lattice and wherein said first cation lattice and said second cation lattice each accommodate substitution of a third cation characterized by a third cation size different from said first cation size and from said second cation size and said solid solution is further characterized by composition dependent electrical properties including ionic conductivity, electronic conductivity and mixed ionic and electronic conductivity.

33. The apparatus of claim 1 wherein said crystalline phase is a single crystal phase.

34. The apparatus of claim 1 wherein said first crystalline phase is a polycrystalline phase.

35. The apparatus of claim 1 wherein said solid electrolyte is further characterized by a solid electrolyte lattice constant and said solid electrode is further characterized by a solid electrode lattice constant and said solid electrolyte lattice constant and said solid electrode lattice constant are characterized by a lattice constant mismatch in the range of from about 0.05% to about 2%.

36. The apparatus of claim 1 wherein said solid electrolyte is further characterized by a solid electrolyte lattice constant and said solid electrode is further characterized by a solid electrode lattice constant and said solid electrolyte lattice constant and said solid electrode lattice constant are characterized by a lattice constant mismatch in the range of from about 0 to about 0.7%.

37. The apparatus of claim 1 wherein said solid electrolyte is characterized by an ionic conductivity activation energy in the range of from about 0.9 ev to about 0.5 ev.

38. The apparatus of claim 1 wherein said solid electrolyte is characterized by an ionic conductivity activation energy in the range of from about 0.7 ev to about 0.5 ev.

39. The apparatus of claim 1 wherein said solid electrode is further characterized by a mixed ionic electronic conductivity and has an ionic conductivity in the range of from about $10^{-1}$ S/cm to about 1 S/cm and an electronic conductivity in the range of from about $10^{-1}$ S/cm to about $10^3$ S/cm.

40. The apparatus of claim 1 wherein said solid electrode is further characterized by a mixed ionic electronic conductivity and has an ionic conductivity in the range of from about $10^{-1}$ S/cm to about 1 S/cm and an electronic conductivity in the range of from about 10 S/cm to about $10^3$ S/cm.

41. The apparatus of claim 1 further comprising first and second solid electrodes in electrical contact with said solid electrolyte, wherein said first and second solid electrodes are characterized, respectively, by first and second solid electrode crystalline phases and said first and second solid electrode crystalline phases are the same as said solid electrolyte crystalline phases.

42. The apparatus of claim 1 wherein said first solid solution further includes a first secondary component and said second solid solution further includes a second secondary component.

43. An electrochemical apparatus comprising:
(1) a solid electrolyte made of solid electrolyte material characterized by a solid electrolyte crystalline phase; and
(2) a solid electrode made of solid electrode material characterized by a solid electrode crystalline phase which is the same as said solid electrolyte crystalline phase and in electrical contact with said solid electrolyte wherein said solid electrolyte is further characterized by a solid electrolyte lattice constant and said solid electrode is further characterized by a solid electrode lattice constant and said solid electrolyte lattice constant and said solid electrode lattice constant are characterized by a lattice constant mismatch in the range of from about 0.1% to about 5% and wherein said solid electrolyte and said solid electrode are further characterized by a thermal expansion coefficient mismatch and are configured as a monolithic graded structure further including a layer characterized by a graded composition to minimize said lattice constant mismatch and said thermal expansion coefficient mismatch.

44. The apparatus of claim 43 wherein said crystalline phase is a titanate solid solution having a pyrochlore crystal structure and characterized by the formula $A_2Ti_2O_{7-\delta}$ wherein A is an A cation of an element selected from the group consisting of Sm, Gd, Ho, Ce, Pr, Nd, Pm, Eu, Tb, Dy, Er, Tm, Yb, Lu, Y, Sc, Bi, Pb and mixtures thereof and wherein $\delta$ indicates the extent of oxygen deficiency or excess relative to seven oxygens per formula unit and is in the range of from about $\pm 0.001$ to about $\pm 0.3$.

45. The apparatus of claim 44 wherein said A cation is a $Gd^{3+}$ cation.

46. The apparatus of claim 44 wherein said A cation is further characterized by an A cation valence and is partially replaced by a first dopant cation characterized by a first dopant cation valence which is lower than said A cation valence.

47. The apparatus of claim 46 wherein said first dopant cation is a cation and said titanate solid solution is further characterized by the formula $(Gd_{1-j}Ca_j)_2Ti_2O_{7-\delta}$; j is in the range of from about 0 to about 0.25 and $\delta$ is approximately equal to j to increase ionic conductivity of said solid electrolyte.

48. The apparatus of claim 46 wherein said first dopant cation is an $Al^{3+}$ cation and said titanate solid solution is further characterized by the formula $Gd_2(Ti_{1-k}Al_k)_2O_{7-\delta}$; k is in the range of from about 0 to about 0.05 and $\epsilon$ is approximately equal to k to increase ionic conductivity of said solid electrolyte.

49. The apparatus of claim 46 wherein said first dopant cation is a $Ca^{2+}$ cation and said titanate solid solution is further characterized by the formula $(Gd_{1-j}Ca_j)_2Ti_2O_{7-\delta}$; j is in the range of from about 0.0025 to about 0.15 and $\delta$ is approximately equal to j to increase ionic conductivity of said solid electrolyte.

50. The apparatus of claim 46 wherein said first dopant cation is a $Ca^{2+}$ cation and said titanate solid solution is further characterized by the formula $(Gd_{1-j}Ca_j)_2Ti_2O_{7-\delta}$; j is in the range of from about 0.02 to about 0.10 and $\delta$ is approximately equal to j to increase ionic conductivity of said solid electrolyte.

51. The apparatus of claim 46 wherein said first dopant cation is an $Al^{3+}$ cation and said titanate solid solution is further characterized by the formula $(Gd_{1-k}Al_k)_2O_{7-\delta}$; k is in the range of from about 0.005 to about 0.05 and $\delta$ is approximately equal to k to increase ionic conductivity of said solid electrolyte.

52. The apparatus of claim 46 wherein said first dopant cation is an $Al^{3+}$ cation and said titanate solid solution is further characterized by the formula $Gd_2(Ti_{1-k}Al_k)_2O_{7-\delta}$; k is in the range of from about 0.01 to about 0.02 and $\delta$ is approximately equal to k/2 to increase ionic conductivity of said solid electrolyte.

53. The apparatus of claim 44 wherein said A cation is partially replaced by a smaller, isovalent cation selected from the group consisting of $Dy^{3+}$, $Y^{3+}$ and $Ho^{3+}$ to increase ionic conductivity of said solid electrolyte.

54. The apparatus of claim 44 wherein in said formula $A_2Ti_2O_{7-\delta}$ Ti is partially replaced by a larger, isovalent cation selected from the group consisting of $Zr^{4+}$, $Sn^{4+}$ and $Hf^{4+}$ to increase ionic conductivity of said solid electrolyte.

55. The apparatus of claim 44 wherein in said formula $A_2Ti_2O_{7-\delta}$, Ti is replaced by a donor cation selected from the group consisting of $Nb^{5+}$, $W^{6+}$, $Mo^{6+}$, $Ta^{5+}$ and $V^{5+}$ to increase electronic conductivity of said solid solution.

56. The apparatus of claim 44 wherein said A cation is further characterized by an A cation valence and is partially replaced by a second dopant cation having a second dopant cation valence higher than said A cation valence.

57. The apparatus of claim 56 wherein said second dopant cation is selected from the group consisting of $Th^{4+}$, $U^{5+}$, $Ce^{4+}$, $Pr^{4+}$ and $Tb^{4+}$ to increase electronic conductivity of said solid solution.

58. The apparatus of claim 44 wherein in said formula $A_2TiO_{y-\delta}$, Ti is partially replaced with a variable valence acceptor dopant cation to simultaneously increase ionic conductivity and electronic conductivity of said solid solution.

59. The apparatus of claim 58 wherein said acceptor dopant cation is a cation of an element selected from the group consisting of Ru, Os, Ir, Rh, Pd, Pt, Re, Mn, Fe, Co, Ni and Cr present in said apparatus in sufficient concentration to form an impurity band.

60. The apparatus of claim 43 wherein said crystalline phase is a solid solution having a perovskite crystal structure and characterized by the formula $ABO_{3-\delta}$ wherein A is an A cation of an element selected from the group consisting of Ba, Sr, La, Ca, Pb and Bi; B is selected from the group consisting of Sr, Mn, Cu, Fe, Ti, Zr, Co, Ni, In, Mg, Zn, Sc, Ta, Nb and Al and $\delta$ is in the range of from 0 to about 3 and wherein in said formula $ABO_{3-\delta}$ said B cation is partially replaced by a cation selected from the group consisting of $Zr^{4+}$, $Ce^{4+}$, $Th^{4+}$ and $Hf^{4+}$ to increase ionic conductivity of said solid electrolyte.

61. The apparatus of claim 43 wherein said electrochemical apparatus is a graded solid oxide fuel cell.

62. The apparatus of claim 61 wherein said graded solid oxide fuel cell further comprises:
(1) a solid oxide anode layer made of an anode material characterized by a first crystalline phase;
(2) a solid oxide electrolyte layer made of an electrolyte material characterized by said first crystalline phase;
(3) a solid oxide cathode layer made of a cathode material characterized by said first crystalline phase;
(4) a first graded region separating said solid oxide anode layer from said solid oxide electrolyte layer; and
(5) a second graded region separating said solid oxide electrolyte layer from said solid oxide cathode layer.

63. The apparatus of claim 62 wherein said solid oxide anode layer is further characterized by a solid oxide anode layer composition, said solid oxide cathode layer is further characterized by a solid oxide cathode layer composition, said solid oxide electrolyte layer is further characterized by a solid oxide electrolyte layer composition, said first graded layer is further characterized by a first graded layer/anode interface and a first graded layer/electrolyte interface and said first graded layer has a spatially graded composition which varies from said solid oxide anode layer composition at said first graded layer/anode interface to said solid oxide electrolyte layer composition at said first graded layer/electrolyte interface and said second graded layer is further characterized by a second graded layer/electrolyte interface and by a second graded layer/cathode interface and said second graded layer has a spatially graded composition which varies from said solid oxide electrolyte layer composition at said second graded layer/electrolyte interface to said solid oxide cathode composition at said second graded layer/cathode interface.

64. The apparatus of claim 62 wherein said solid electrolyte layer has a solid oxide electrolyte layer thickness as small as 100 Angstroms.

65. The apparatus of claim 43 wherein said crystalline phase is a titanate solid solution having a pyrochlore crystal structure and characterized by the formula $A_2Ti_2O_{7-\delta}$ wherein A is an A cation of an element selected from the group consisting of Sm, Gd, Ho, Ce, Pr, Nd, Pm, Eu, Tb, Dy, Er, Tm, Yb, Lu, Y, Sc, Bi, Pb and mixtures thereof and wherein $\delta$ indicates the extent of oxygen deficiency or excess relative to seven oxygens per formula unit and is in the range of from about $\pm 0.001$ to about $\pm 0.2$.

66. The apparatus of claim 43 wherein said crystalline phase is a titanate solid solution having a pyrochlore crystal structure and characterized by the formula $A_2Ti_2O_{7-\delta}$ wherein A is an A cation of an element selected from the group consisting of Sm, Gd, Ho, Ce, Pr, Nd, Pm, Eu, Tb, Dy, Er, Tm, Yb, Lu, Y, Sc, Bi, Pb and mixtures thereof and wherein $\delta$ indicates the extent of oxygen deficiency or excess relative to seven oxygens per formula unit and is in the range of from about $\pm 0.01$ to about $\pm 0.1$.

67. An electrochemical apparatus comprising:
(1) a solid electrolyte made of solid electrolyte material characterized by a solid electrolyte crystalline phase; and
(2) a solid electrode made of solid electrode material characterized by a solid electrode crystalline phase which is the same as said solid electrolyte crystalline phase and in electrical contact with said solid electrolyte wherein said solid electrolyte and said solid electrode are selected from the group of materials consisting of a solid solution having a pyrochlore crystal structure and characterized by the formula $A_2B_2O_{7-\delta}$ wherein A is an A cation of an element selected from the group consisting of Sm, Gd, Ho, Pr, Nd, Pm, Eu, Tb, Dy, Er, Tm, Yb, Lu, Y, Sc, Bi, Pb and mixtures thereof and B is a cation selected from the group consisting of Al, Cr, Mn, Fe, Co, Ni, Cu, In, Ti, Zr, Hf, Sn, Pb, Ru, Os, Ir, Rh, Pd, Pt, Sb, V, Nb, Ta, Mo, W and mixtures thereof and wherein $\delta$ indicates the extent of oxygen deficiency or excess relative to seven oxygens per formula unit and is in the range of from about $\pm 0.001$ to about $\pm 0.3$; a solid solution having a perovskite crystal structure and characterized by the formula $ABO_{3-\delta}$ wherein A is an A cation of an element selected from the group consisting of Pb and Bi and mixtures thereof, B is selected from the group consisting of Sr, Ti, Zr, In, Mg, Zn, Sc, Ta, Nb and Al and mixtures thereof and $\delta$ is in the range of from 0 to about 3; and a solid solution having a fluorite crystal structure and characterized by the formula $A_{1-j}D_jO_{2\pm\epsilon}$ wherein A is an A cation of an element selected from the group consisting of Ce, Pr, Hf and Th and mixtures thereof, and D is a D cation of an element selected from the group consisting of Pr and Tb and mixtures thereof $20 \leq j < 1$, and s indicates the extent of oxygen deficiency or excess relative to two oxygens per formula unit and $\epsilon$ is in the range of from about 0 to about $\pm 0.3$.

* * * * *

UNITED STATES PATENT AND TRADEMARK OFFICE
CERTIFICATE OF CORRECTION

PATENT NO. : 5,403,461

DATED : Apr. 4, 1995

INVENTOR(S) : Harry L. Tuller et al.

It is certified that error appears in the above-identified patent and that said Letters Patent is hereby corrected as shown below:

Column 2, line 36: after "electrodes", insert --,--.
Column 3, line 40: after "log", insert --$\sigma_e$--.
Column 5, line 33: change "St" to --Sr--.
Column 5, line 33: change "Pt" to --Pr--.
Column 5, line 37: after "W", insert --,--.
Column 5, line 39: change "w" to --j--.
Column 5, line 41: third occurrence, change < to --$\leq$--.
Column 5, line 47: change "Pt" to -- Pr --.
Column 5, line 53: change "3.001" to -- 0.001 --.
Column 6, line 10: after "is", insert --in--.
Column 6, line 20: after "Y", insert --$^3$--.
Column 6, line 28: change "MO" to --Mo--.

UNITED STATES PATENT AND TRADEMARK OFFICE
CERTIFICATE OF CORRECTION

PATENT NO. : 5,403,461
DATED : Apr. 4, 1995
INVENTOR(S) : Harry L. Tuller et al.

It is certified that error appears in the above-identified patent and that said Letters Patent is hereby corrected as shown below:

Column 6, line 32: after "Tb", insert --$^4$--.
Column 6, line 50: change "$ABO_{3-6}$" to --$ABO_{3-\delta}$--.
Column 6, line 53: change "A1" to --Al--.
Column 6, line 53: change "6" to --$\delta$--.
Column 7, line 23: change "$A_{i-j}D_jO_{2+\delta}$" to --$A_{1-j}D_jO_{2\pm\varepsilon}$--.
Column 7, line 26: change "e" to --$\varepsilon$--.
Column 7, line 37: change "$A_{i-j}O_{2+\delta}$" to --$A_{1-j}D_jO_{2\pm\varepsilon}$--.
Column 11, line 60: change "a" to --$\sigma$--.
Column 12, line 53: change "32" to -- = --.
Column 13, line 10: change "$(Gd_2Ru_xTi_{1-x})_2O_7$" to --$(Gd_2(Ru_xTi_{1-x})_2O_7$--.
Column 14, line 59: change "62", first occurrence, to --64--.
Column 16, claim 14, line 54: change "s" to --$\varepsilon$--.
Column 16, claim 14, line 56: change "s" to --$\varepsilon$--.

UNITED STATES PATENT AND TRADEMARK OFFICE
CERTIFICATE OF CORRECTION

PATENT NO. : 5,403,461
DATED : Apr. 4, 1995
INVENTOR(S) : Harry L. Tuller et al.

It is certified that error appears in the above-identified patent and that said Letters Patent is hereby corrected as shown below:

Column 17, claim 18, line 32: after "characterized", insert --by--.
Column 17, claim 18, line 15: change "i" to --is a D--.
Column 17, claim 18, line 17: change "s" to --$\varepsilon$--.
Column 17, claim 18, line 17: delete "or", second occurrence.
Column 17, claim 19, line 27: change "rang" to --range--.
Column 18, claim 27, line 2: change "$A_sTi_2O_{7-s}$" to --$A_2Ti_2O_{7-\delta}$--.
Column 18, claim 39, line 68: change "$10^{-1}$" to --$10^{-2}$--.
Column 19, claim 44, line 48: change "5" to -- $\delta$ --.
Column 19, claim 47, line 60: after "a" insert --$Ca^{2+}$--.
Column 19, claim 47, line 62: change "6" to --$\delta$--.
Column 20, claim 48, line 1: change "$\varepsilon$" to --$\delta$--.
Column 20, claim 52, line 25: change "5" to --$\delta$-.

UNITED STATES PATENT AND TRADEMARK OFFICE
CERTIFICATE OF CORRECTION

PATENT NO. : 5,403,461
DATED : Apr. 4, 1995
INVENTOR(S) : Harry L. Tuller et al.

It is certified that error appears in the above-identified patent and that said Letters Patent is hereby corrected as shown below:

Column 20, claim 52, line 25: change "k/2" to --k--.
Column 20, claim 54, line 33: change after "$A_2Ti_2O_{7-\delta}$", insert --,--.
Column 22, claim 67, line 42: change "Al" to --Al--.
Column 22, claim 67, line 50: change "20" to --O--.
Column 22, claim 67, line 50: change "s" to --$\varepsilon$--.

Signed and Sealed this

Eleventh Day of July, 1995

Attest:

BRUCE LEHMAN

Attesting Officer  Commissioner of Patents and Trademarks